United States Patent
Habuka et al.

(10) Patent No.: US 7,263,145 B2
(45) Date of Patent: Aug. 28, 2007

(54) SEMICONDUCTOR INTEGRATED CIRCUIT DEVICE, WIRELESS LAN SYSTEM, AND AUTO GAIN CONTROL SYSTEM

(75) Inventors: Toshihito Habuka, Tamamura (JP); Masaki Noda, Chigasaki (JP); Hiroshi Nogami, Hujisawa (JP); Toyokazu Hori, Kodaira (JP); Tatsuji Matsuura, Tokyo (JP); Kazuaki Hori, Yokohama (JP); Naoto Inokawa, Takasaki (JP)

(73) Assignee: Hitachi, Ltd., Tokyo (JP)

( * ) Notice: Subject to any disclaimer, the term of this patent is extended or adjusted under 35 U.S.C. 154(b) by 820 days.

(21) Appl. No.: 10/617,687

(22) Filed: Jul. 14, 2003

(65) Prior Publication Data
US 2004/0022004 A1 Feb. 5, 2004

(30) Foreign Application Priority Data
Jul. 30, 2002 (JP) .............................. 2002-221233

(51) Int. Cl.
*H04L 27/08* (2006.01)
*H04L 1/02* (2006.01)
(52) U.S. Cl. ...................................... 375/345; 375/347
(58) Field of Classification Search ................ 375/219, 375/295, 316, 267, 347, 345, 297; 455/132, 455/133, 232–236.1
See application file for complete search history.

(56) References Cited

U.S. PATENT DOCUMENTS

| | | | | |
|---|---|---|---|---|
| 5,339,452 A | * | 8/1994 | Sugawara | 455/212 |
| 5,696,798 A | * | 12/1997 | Wright et al. | 375/345 |
| 6,009,317 A | * | 12/1999 | Wynn | 455/296 |
| 6,735,422 B1 | * | 5/2004 | Baldwin et al. | 455/232.1 |
| 6,754,479 B1 | * | 6/2004 | Hughes et al. | 455/245.1 |
| 6,856,946 B2 | * | 2/2005 | Dathe et al. | 702/189 |
| 2002/0086651 A1 | * | 7/2002 | Prentice et al. | 455/234.1 |

FOREIGN PATENT DOCUMENTS

GB  2 316 558  * 2/1998

OTHER PUBLICATIONS

"Standard LAN Guidebook", vol. 2, Revised Third Edition, Multimedia Communication Kenkyu-kai, Askii Inc., Aug. 1, 1998, pp. 235-238.

* cited by examiner

*Primary Examiner*—Tesfaldet Bocure
(74) *Attorney, Agent, or Firm*—Mattingly, Stanger, Malur & Brundidge, P.C.

(57) ABSTRACT

A wireless LAN system has auto gain control with no work load applied to its baseband processing block. When the wireless LAN system gets ready to receive a signal, the gain control circuit switches between the receiving antennas. The gain control circuit sets gain setting value time divisional data according to the level of a received signal to roughly control the gain to be set in the LAN and the gain to be set in two programmable gain amplifiers.

11 Claims, 19 Drawing Sheets

FIG. 12

| TERMINAL NAME | | ATTRIBUTE | FUNCTION | REMARK | CORRESPONDENCE TO SYMBOLS IN FIG. 1 |
|---|---|---|---|---|---|
| RECEIVED SIGNAL | RSSIOUT | OUT/Analog | RSSI OUTPUT | | MEASURED SIGNAL MRI |
| | RXBBOUTIX | OUT/Analog | RECEIVED BASEBAND I SIGNAL (Positive) | | I SIGNAL |
| | RXBBOUTIY | OUT/Analog | RECEIVED BASEBAND I SIGNAL (Negative) | | |
| | RXBBOUTQX | OUT/Analog | RECEIVED BASEBAND Q SIGNAL (Positive) | | Q SIGNAL |
| | RXBBOUTQY | OUT/Analog | RECEIVED BASEBAND Q SIGNAL (Negative) | | |
| CONTROL SIGNAL | AGCGAIN[3] | IN/Digital | AGC GAIN SETTING VALUE INPUT, MSB | (SEE FIG. 11) | GAIN SETTING VALUE TIME DIVISION DATA TD |
| | AGCGAIN[2] | IN/Digital | AGC GAIN SETTING VALUE INPUT | | |
| | AGCGAIN[1] | IN/Digital | AGC GAIN SETTING VALUE INPUT | | |
| | AGCGAIN[0] | IN/Digital | AGC GAIN SETTING VALUE INPUT, LSB | | |
| | WAIT | IN/Digital | AGC GAIN SETTING VALUE LATCHING TIMING & DC OFFSET SETTING CONTROL | | DC OFFSET CANCEL CONTROL/GAIN DATA LATCH SIGNAL KS |
| | MODE[2] | IN/Digital | INPUT FOR OPERATION AND POWER SAVING MODE SETTING | (SEE TABLE 2-(1)) | MODE CONTROL SIGNAL MC |
| | MODE[1] | IN/Digital | | | |
| | MODE[0] | IN/Digital | | | |
| | LE | IN/Digital | 3-wire interface, LOAD ENABLE | (SEE TABLE 2-(2))<br>(SEE FIG. 15) | |
| | SDATA | IN/Digital | 3-wire interface, SERIAL DATA | | |
| | SCLK | IN/Digital | 3-wire interface, SERIAL CLOCK | | |
| | REFCLK | IN/Digital | 20MHz REFERENCE CLOCK INPUT | | REFERENCE CLOCK SCLK |
| SIGNAL TO SEND | TXBBINIX | IN/Analog | BASEBAND I SIGNAL TO SEND (Positive) | | I SIGNAL |
| | TXBBINIY | IN/Analog | BASEBAND I SIGNAL TO SEND (Negative) | | |
| | TXBBINQX | IN/Analog | BASEBAND Q SIGNAL TO SEND (Positive) | | Q SIGNAL |
| | TXBBINQY | IN/Analog | BASEBAND Q SIGNAL TO SEND (Negative) | | |

FIG. 13

| Bit | | | Description | | |
|---|---|---|---|---|---|
| MODE [2] | MODE [1] | MODE [0] | Mode | Status | Power-on Block |
| 0 | 0 | 0 | Idle | MAXIMUM POWER SAVING | — |
| 0 | 0 | 1 | Pre-Heat | ONLY BGR CIRCUIT ON | |
| 0 | 1 | 0 | Warm-Up | BGR-Synthesizer OPERATION | |
| 0 | 1 | 1 | TX-Cal | TRANSMISSION BLOCK CALIBRATION | |
| 0 | 0 | 0 | RX-Cal | RECEIVING BLOCK CALIBRATION | |
| 1 | 0 | 1 | RX | RECEIVING OPERATION | |
| 1 | 1 | 0 | TX | TRANSMISSION OPERATION | |
| 1 | 1 | 1 | TBD | TBD | TBD |

FIG. 14

| Register | Word # | Serial Bits | | | | | | |
|---|---|---|---|---|---|---|---|---|
| | | LSB | 2 | 3 | 4 | 5 | 6 | 7 | 8 | MSB |
| Test | 0 | 0 | T0 | T1 | T2 | T3 | T4 | T5 | T6 |
| Synth Ch | 0 | 1 | SR | C0 | C1 | C2 | C3 | C4 | C5 |
| TX Power | 1 | 0 | P0 | P1 | P2 | P3 | Don't Care | | |
| (TBD) | 1 | 1 | (TBD) | | | | | | |

SEMICONDUCTOR INTEGRATED CIRCUIT DEVICE, WIRELESS LAN SYSTEM, AND AUTO GAIN CONTROL SYSTEM

BACKGROUND OF THE INVENTION

The present invention relates to a technique for transmitting/receiving signals from/in a wireless LAN system, more particularly to a technique to be employed effectively for auto gain controlling of received signals.

A wireless LAN (Local Area Network) usually needs auto gain controlling for correcting the signal level of each received signal according to the signal strength.

The IEEE802.11a standard makes arrangements for such auto gain controlling, as well as synchronization detecting, etc. to be carried out at the initial part of each received packet signal, that is, in the 8 µs preamble period of the signal, so that the gain controlling must be completed actually within a period of 5 µs or so.

In the examination carried out by the present inventors, two semiconductor integrated circuit devices are used for RF (high frequency) processing and baseband processing in such auto gain controlling.

The semiconductor integrated circuit device for RF processing converts received signals to baseband signals. The semiconductor integrated circuit device for baseband processing converts signals whose frequencies have been changed by an RF chip to digital signals, then measures the level of each of the digital signals to control the signal level.

While the semiconductor integrated circuit device for RF processing receives signals within a level range of −82 dBm to −30 dBm, the semiconductor integrated circuit device for baseband processing must control signal levels within a range of ±2 dBm. If the semiconductor integrated circuit device for baseband processing receives a weaker level digital signal, the circuit device comes to perform an auto correlation processing for the signal and uses the signal for controlling the signal level.

Such a wireless LAN system is described in detail in the "Standard LAN Guidebook" (the second volume)(revised third edition), pp235 to 238, edited by Multimedia Communication Kenkyu-kai, published by Askii Inc., Aug. 1, 1998). This guidebook describes a wireless LAN architecture conforming to the IEEE802.11.

SUMMARY OF THE INVENTION

However, the present inventors have found the following problems in the conventional auto gain controlling technique employed for the wireless LAN system as described above.

If a semiconductor integrated circuit device for baseband processing receives a weak level digital signal as described above, a high-order technique is required to measure the signal level through auto correlation and the semiconductor integrated circuit device comes to have a heavy work load.

Makers dedicated to the manufacturing of such semiconductor integrated circuit devices for RF processing come to demand the high-order technique to be realized in the semiconductor integrated circuit devices for baseband processing, resulting in losing their competitive powers. This has been a disadvantage of the conventional technique.

It is an object of the present invention to provide a semiconductor integrated circuit device, a wireless LAN system, and an auto gain control system that can realize such auto gain controlling accurately and quickly.

It is another object of the present invention to provide a semiconductor integrated circuit device, a wireless LAN system, and an auto gain control system that can realize such auto gain controlling accurately and quickly with no work load to be applied to the subject semiconductor integrated circuit device for baseband processing.

These and other objects, as well as the novel features of the present invention may be readily ascertained by referring to the following description and appended drawings.

The typical one of the aspects of the present invention disclosed in this document will be described briefly as follows.

1. The typical aspect of the present invention is a high frequency processing semiconductor integrated circuit device to be mounted in a communication apparatus together with a base band processing semiconductor integrated device and capable of handling wireless data. The high frequency processing semiconductor integrated circuit device is provided with a first measurement circuit for measuring the signal level of each received signal in wireless data communication and outputting a first signal level measurement signal used for gain controlling.

Other aspects of the present invention will also be described briefly below.

2. In the semiconductor integrated circuit device according to the item 1, the first signal level measurement signal output from the first measurement circuit is a logarithmically compressed signal.

3. In the semiconductor integrated circuit device according to the item 1 or 2, the circuit device further includes an addition block for adding up I and Q analog signals converted to baseband signals and the first measurement circuit measures a signal obtained by adding up the I and Q signals.

4. The semiconductor integrated circuit device according to the item 1 or 2 further includes an addition block for squaring each of the analog signals I and Q and adding up the squared I and Q signals while the first measurement circuit measures a signal obtained by adding up the I and Q signals in the addition block.

5. The semiconductor integrated circuit device according to the item 1 or 2 further includes an addition block for obtaining the absolute value from each of the analog signals I and Q and adding up those absolute values while the first measurement circuit measures a signal obtained by adding up the absolute values in the addition block.

6. The wireless LAN system according to one aspect of the present invention comprises a first measurement circuit for measuring a signal level of each received signal in wireless data communication and outputting a first signal measurement signal used for gain controlling, a control circuit for switching between at least two antennas at every certain time if no received signal is detected in the received signal detection carried out according to the result of the measurement by the first measurement circuit, suspending the switching if a received signal is detected, to generate an antenna switchover signal for fixing the connection of the antenna that has detected the received signal, and an antenna switch for controlling the switching between at least the two antennas according to an antenna switchover signal received from the control circuit.

7. The wireless LAN system according to another aspect of the present invention comprises a first measurement circuit for measuring a signal level of each received signal in wireless data communication and outputting a first signal level measurement signal used for rough gain controlling, a second measurement circuit for measuring signal levels of inputted I and Q signals and outputting a second signal level measurement signal used for minute gain controlling, a control circuit for generating first and second gain setting data according to the first and second signal level measurement signals output from the first and second measurement circuits, a gain control circuit for generating first and second gain setting data according to a gain setting value output from the control circuit, and a programmable gain amplifier for amplifying both I and Q signals according to the first and second gain setting data output from the gain control circuit.

8. In the wireless LAN system according to the item 6 or 7, the gain setting value output from the control circuit is time divisional data.

9. The wireless LAN system according to any of the items 6 to 8 includes a test signal generation block (gain control circuit) for generating a test signal according to a transmission circuit adjustment command and an adjustment circuit for measuring an output level of the transmission baseband amplifier according to a test signal output from the test signal generation block to adjust the output level of the transmission baseband amplifier so that the output level comes within a predetermined range.

10. An auto gain control system according to one aspect of the present invention comprises a measurement circuit for measuring a signal level of each received signal in wireless data communication, a gain control block for calculating a gain of a programmable gain amplifier from a signal level measured by the measurement circuit and outputting the result as gain setting data, and a programmable gain amplifier for controlling a gain used to amplify the I and Q signals according to gain setting data output from the gain control block.

11. The auto gain control system in another aspect of the present invention comprises a plurality of measurement circuits, each used for measuring a signal level of each received signal in wireless data communication, a gain control block for outputting gain setting data according to a signal level measured by each of the plurality of measurement circuits, and a programmable gain amplifier for controlling a gain used to amplify each of I and Q signals according to each gain setting data output from the gain control block. Each of the plurality of measurement circuits has a measurement accuracy different from others and the programmable gain amplifier uses the plurality of gain setting data sequentially in an ascending order of signal level measurement accuracy to make the controlling.

12. The auto gain control system according to still another aspect of the present invention comprises a first measurement circuit for measuring a signal level of each received signal in wireless data communication and outputting a first signal level measurement signal used for logarithmically compressed rough gain controlling, a second measurement circuit for measuring a signal level of each of the inputted I and Q signals in a linear scale and outputting a second signal level measurement signal used for minute gain controlling, a control circuit for generating a gain setting value according to the first and second signal level measurement signals output from the first and second measurement circuits, a gain control circuit for generating first and second gain setting data according to a gain setting value output from the control circuit so as to make the gain controlling, and a programmable gain amplifier for amplifying the I and Q signals according to the first and second gain setting data output from the gain control circuit.

13. In the auto gain control system according to the item 12, the programmable gain amplifier is configured by three programmable gain amplifiers connected serially. In the two programmable gain amplifiers disposed in the front step, a gain is set which is respectively used to amplify said I and Q signals according to the first gain setting data generated from the first signal level measurement signal by the gain control circuit. In the programmable gain amplifier in the rear step, a gain is set which is used to amplify said I and Q signals according to the second gain setting data generated from the second signal level measurement signal by the gain control circuit.

14. In the auto gain control system according to the item 13, each of the three programmable gain amplifiers is provided with a DC offset cancellation block for canceling an DC offset. The control circuit outputs a DC offset cancel signal for canceling a DC offset generated upon switching among gains in the three programmable gain amplifiers.

15. In the auto gain control system according to any of the items 10 to 14, the gain setting data is time divisional data.

16. The auto gain control system according to any of the items 12 to 15 further includes a control circuit for determining whether or not a received signal is detected according to the result of measurement in said first measurement circuit to make switching between at least two antennas at every fixed time if no received signal is detected or to suspend the switching between the two antennas if a received signal is detected so as to generate a switchover signal for fixing the connection of the antenna that has received the signal and an antenna switch block for switching between at least the two antennas according to an antenna switchover signal received from the control circuit.

17. The auto gain control system according to any of the items 12 to 16 further includes a low noise amplifier for amplifying a signal received by one of the antennas. The low noise amplifier has a gain controlled according to the gain switchover data generated by the gain control circuit from a gain setting value according to the first signal level measurement signal.

18. The auto gain control system according still another aspect of the present invention comprises a second measurement circuit for measuring signal levels of inputted I and Q signals and outputting a second signal level measurement signal, a control circuit for generating a gain setting value according to the second signal level measurement signal output from the second measurement circuit, a gain control circuit for controlling a gain used to generate second gain setting data according to the gain setting value output from the control circuit, a programmable gain amplifier for amplifying I and Q signals according to the second gain setting data output from the gain control circuit, and a bypass switch for switching between destinations according to a switchover signal to transfer a signal output from a transmission baseband amplifier to the programmable gain amplifier at the time of signal transmission. The system switches over the bypass switch to output a transmit signal to the gain amplifier and instructs the second measurement circuit to measure a characteristic error of each of I and Q signals output from the programmable gain amplifier to adjust the gain of the programmable gain amplifier.

BRIEF DESCRIPTION OF THE DRAWINGS

FIG. 12 is a table of signals exchanged between the RF processing block and the baseband processing block provided in the wireless LAN system shown in FIG. 1;

FIG. 13 is a table of detailed settings by the MODE signal in a control signal shown in FIG. 12;

FIG. 14 is a detailed register map of a serial interface shown in FIG. 12;

DETAILED DESCRIPTION OF THE PREFERRED EMBODIMENTS

Hereunder, the preferred embodiments of the present invention will be described in detail with reference to the appended drawings.

First Embodiment

Figure 1:
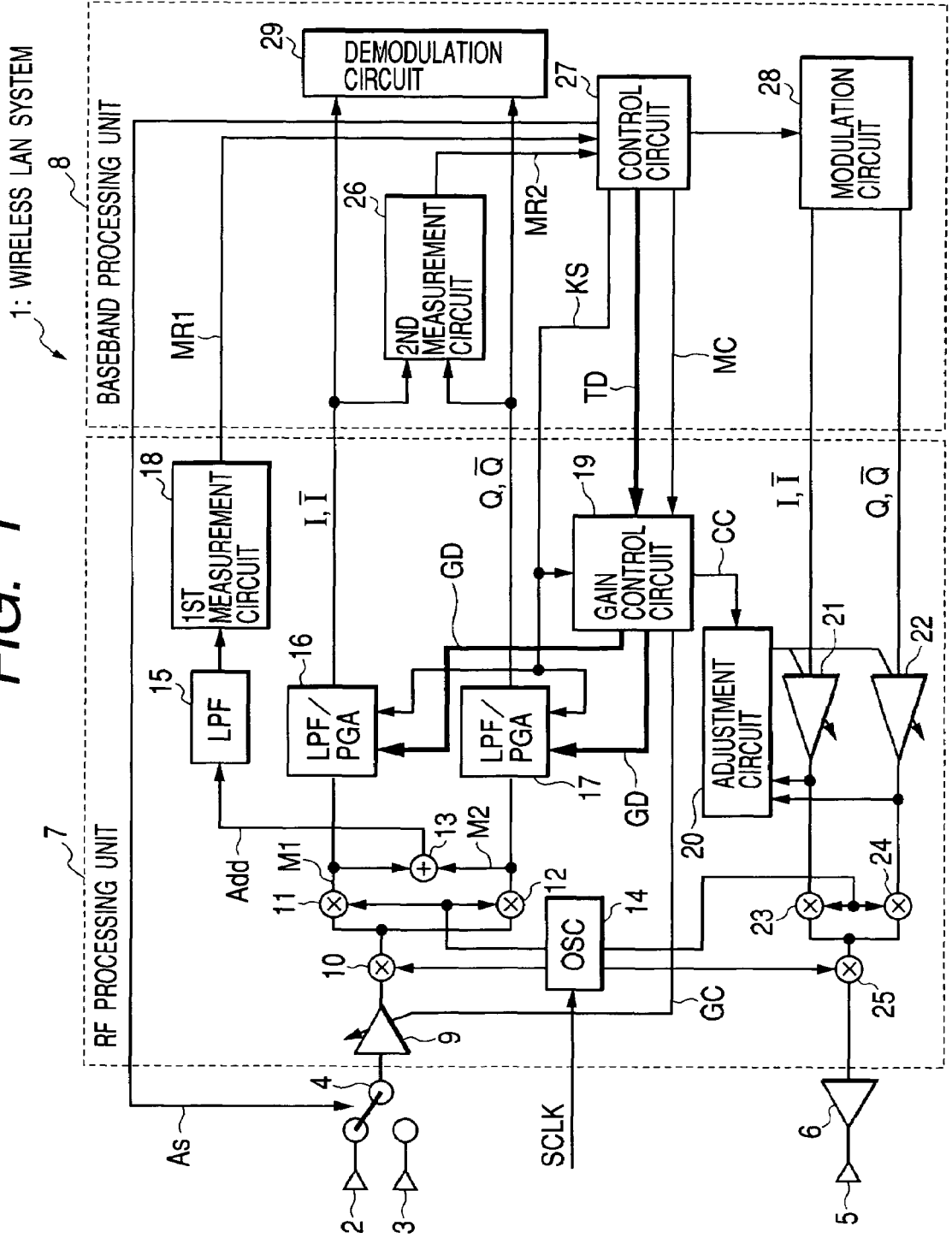
FIG. 1 is a block diagram of a wireless LAN system in the first embodiment of the present invention.
Figure 2:
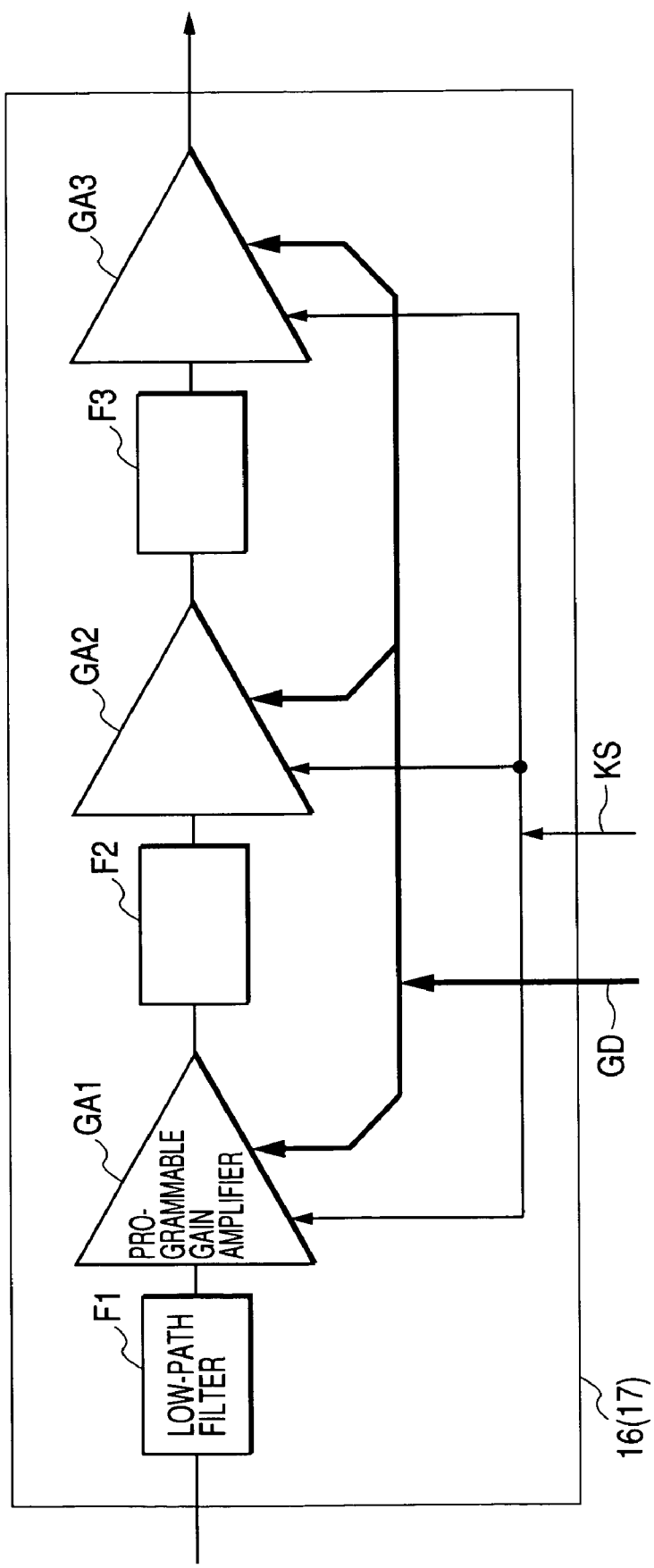
FIG. 2 is a block diagram of an LPF/PGA circuit provided in the wireless LAN system shown in FIG. 1.
Figure 3:
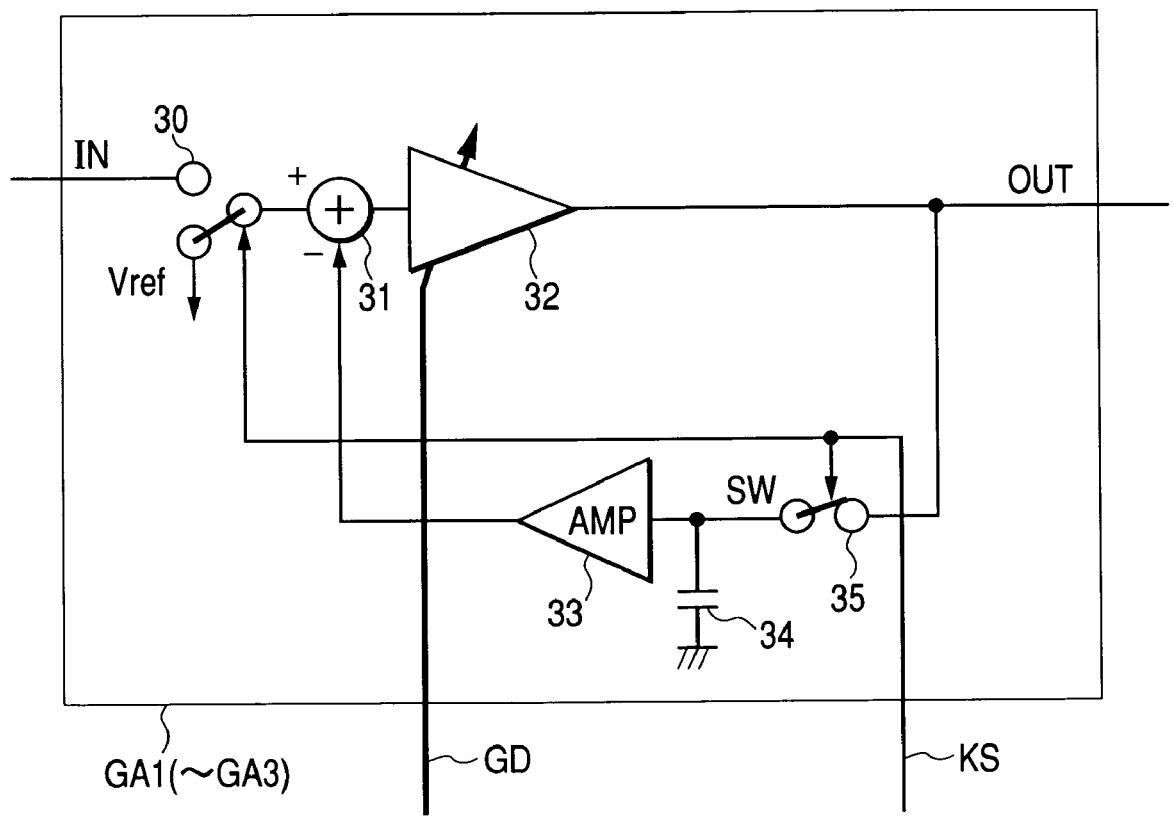
FIG. 3 is a circuit diagram of a programmable gain amplifier provided in the LPF/PGA circuit shown in FIG. 2.
Figure 4:
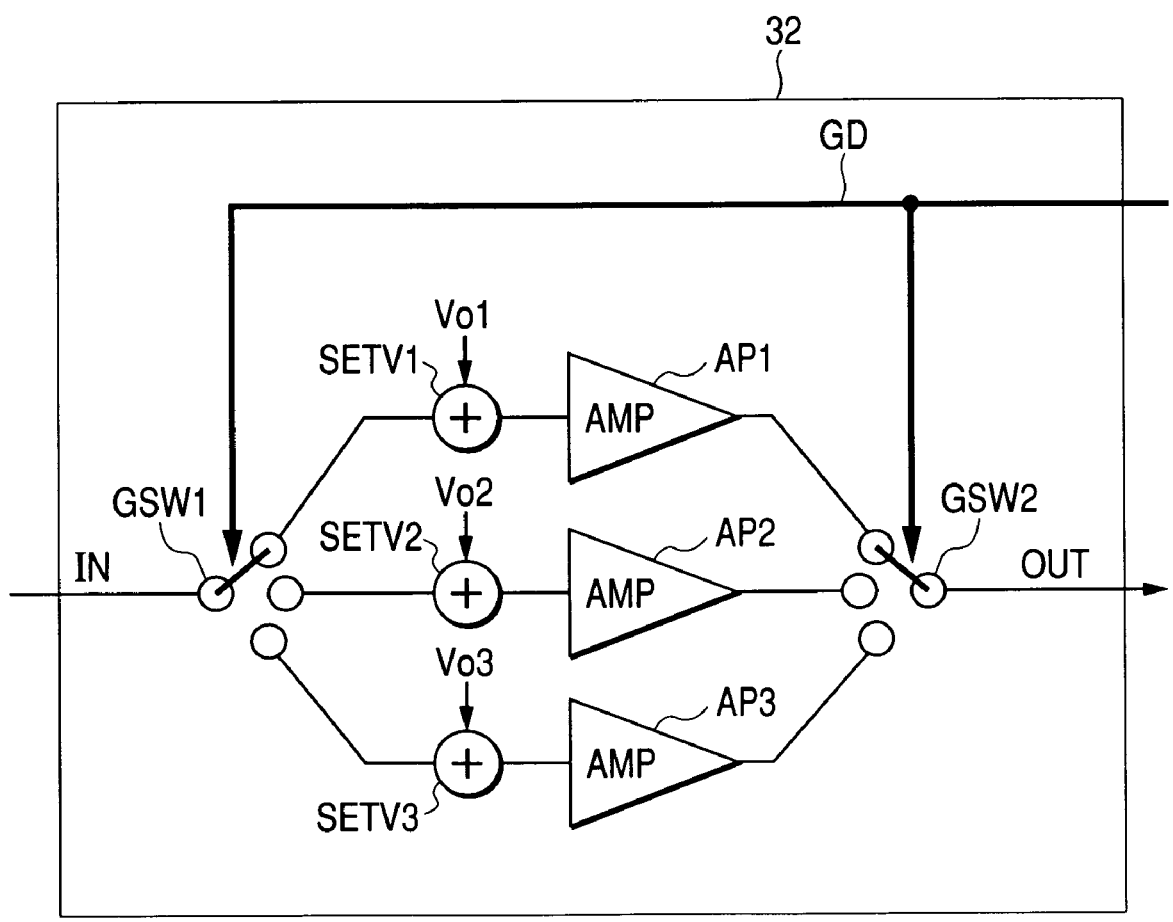
FIG. 4 is a circuit diagram of a variable gain amplifier provided in the programmable gain amplifier shown in FIG. 3.
Figure 5:
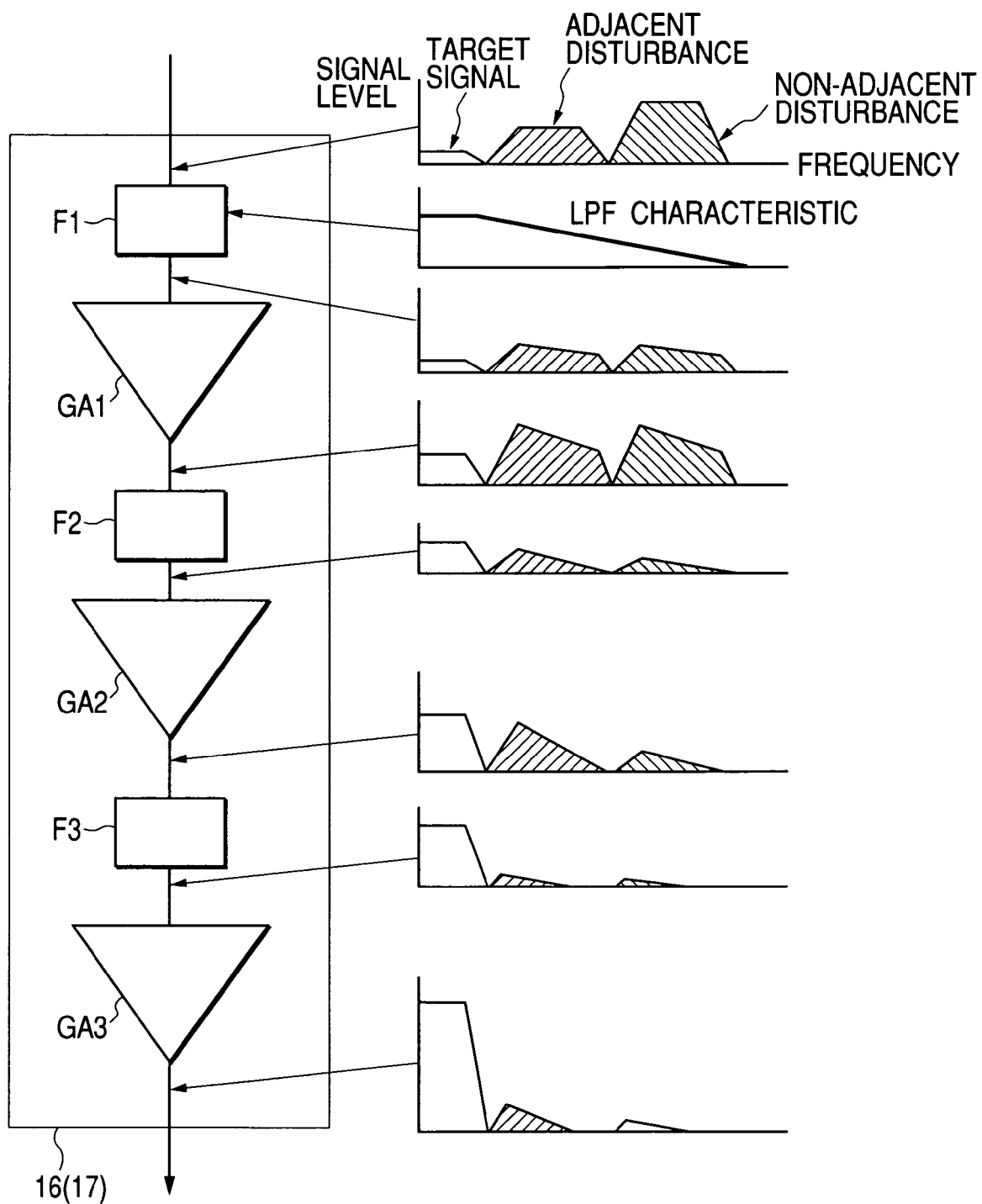
FIG. 5 is an illustration for describing how a target signal is amplified by the LPF/PGA circuit shown in FIG. 2.
Figure 6:
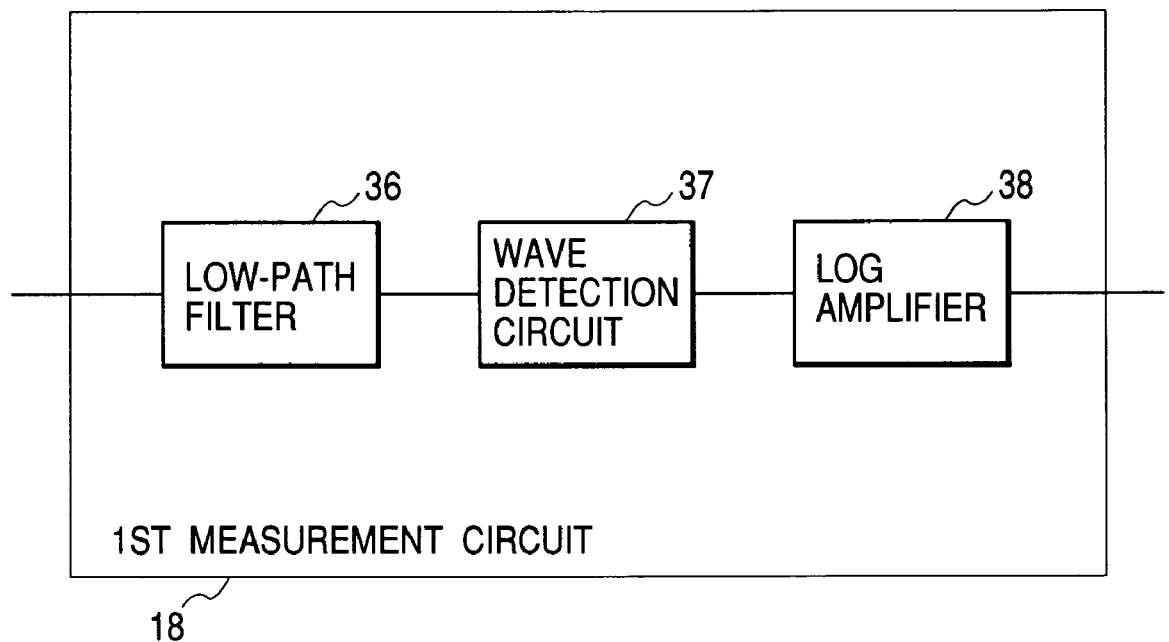
FIG. 6 is a block diagram of a first measurement circuit provided in the wireless LAN system shown in FIG. 1.
Figure 7:
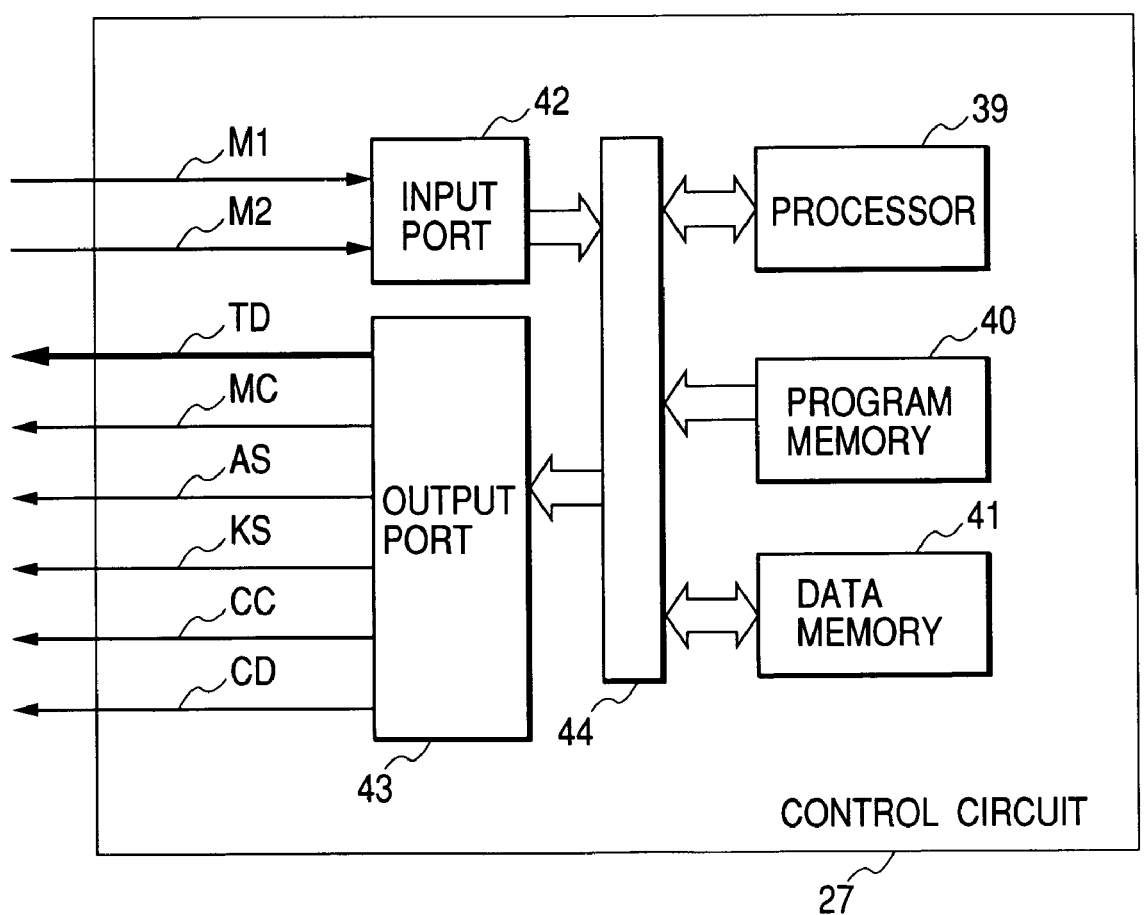
FIG. 7 is a block diagram of a control circuit provided in the wireless LAN system shown in FIG. 1.
Figure 8:
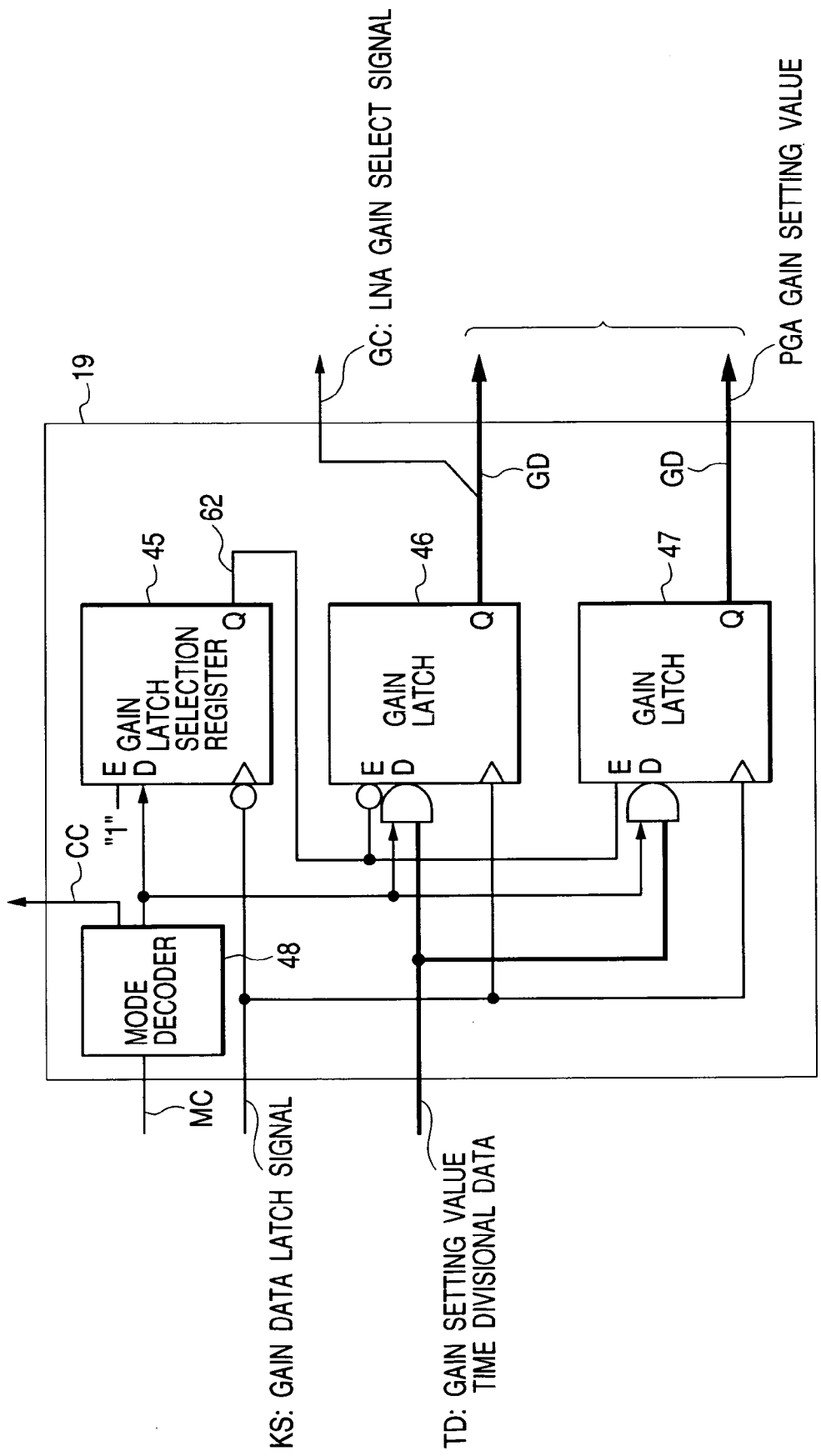
FIG. 8 is a block diagram of a gain control circuit provided in the wireless LAN system shown in FIG. 1.
Figure 9:
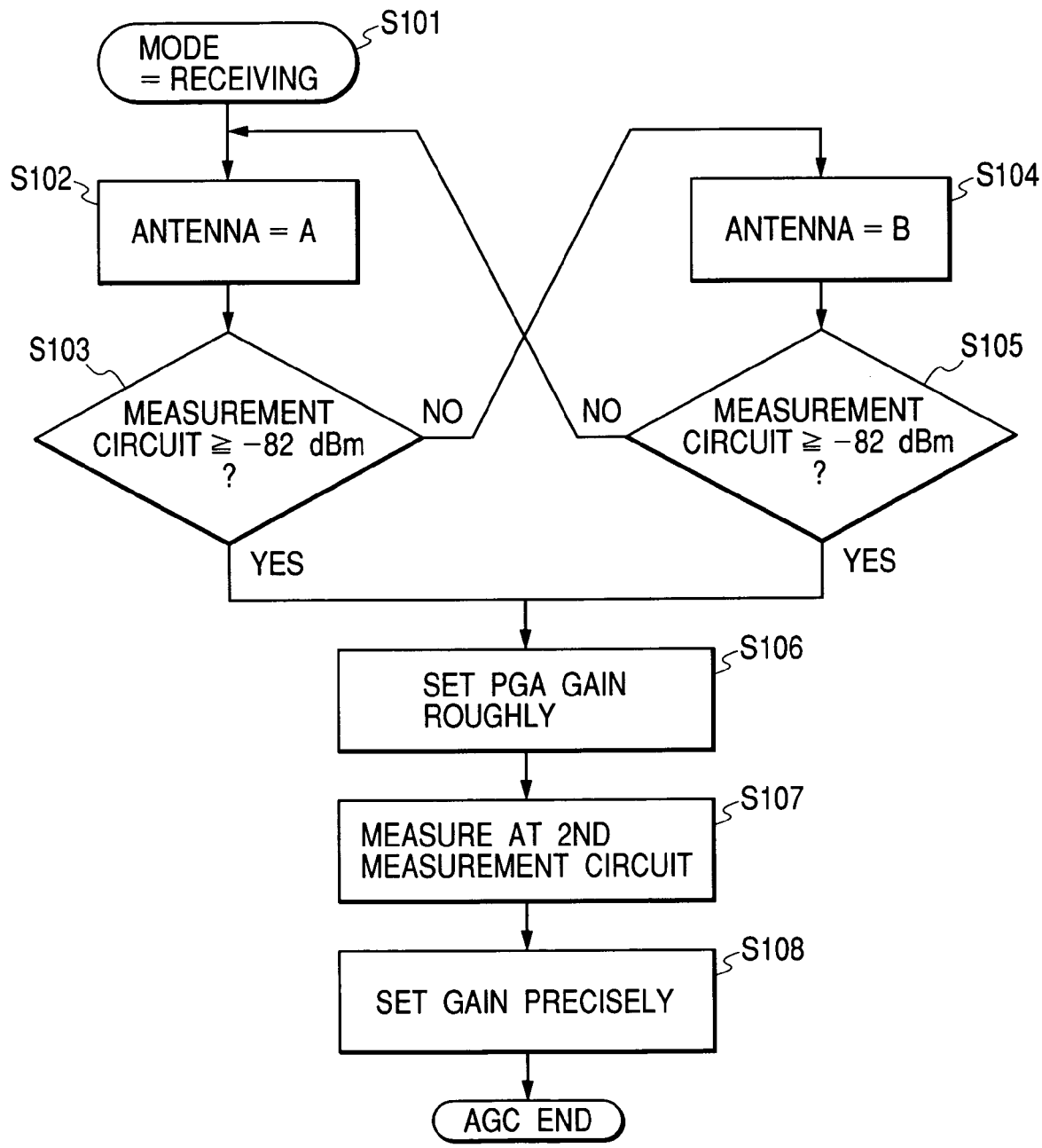
FIG. 9 is a flowchart of the operation of the control circuit provided in the wireless LAN system shown in FIG. 1.
Figure 10:
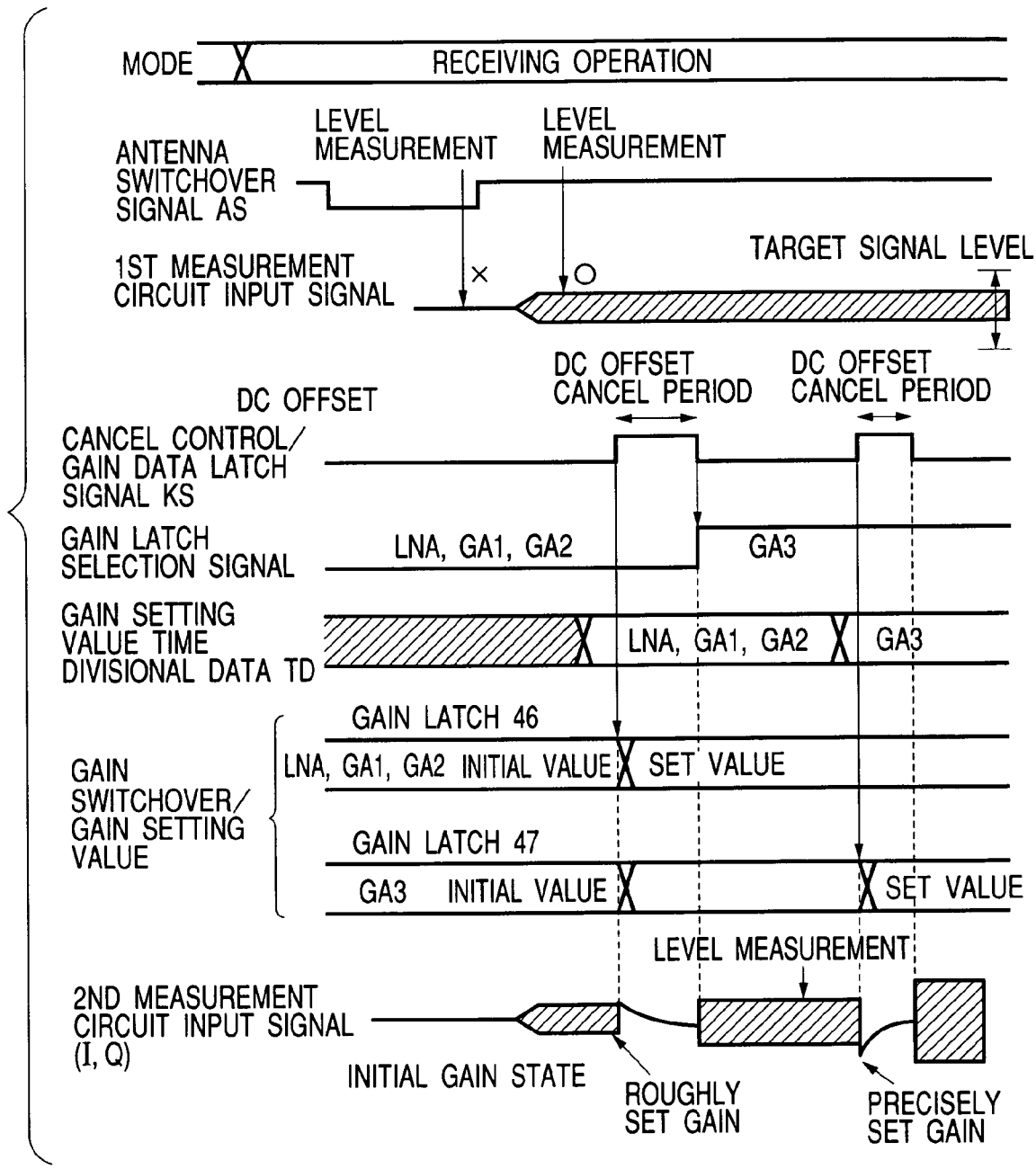
FIG. 10 is a time divisional chart of the flowchart shown in FIG. 9.
Figure 11:
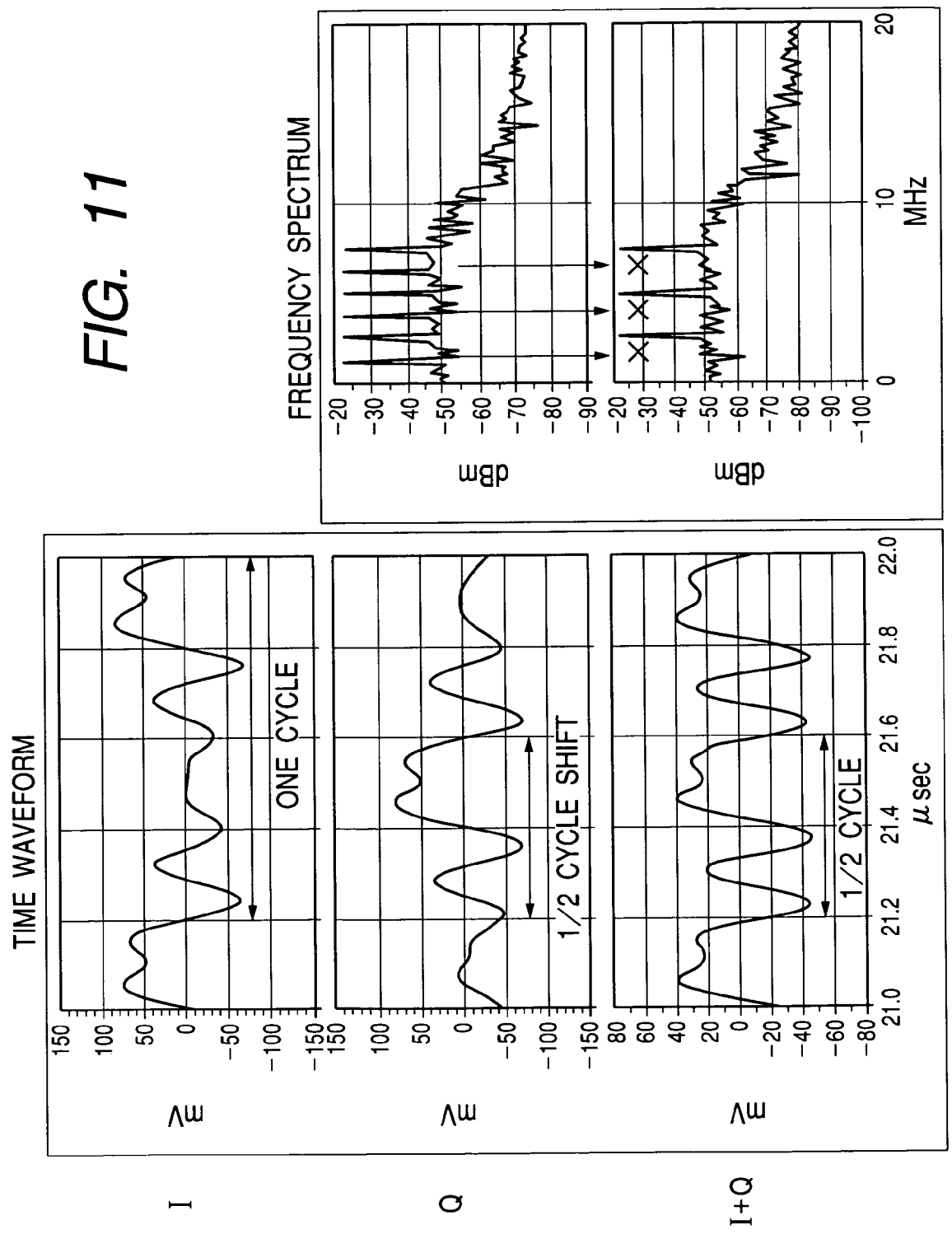
FIG. 11 is a graph of the waveforms of baseband signals in a short symbol period of the wireless LAN system shown in FIG. 1.
Figure 15:
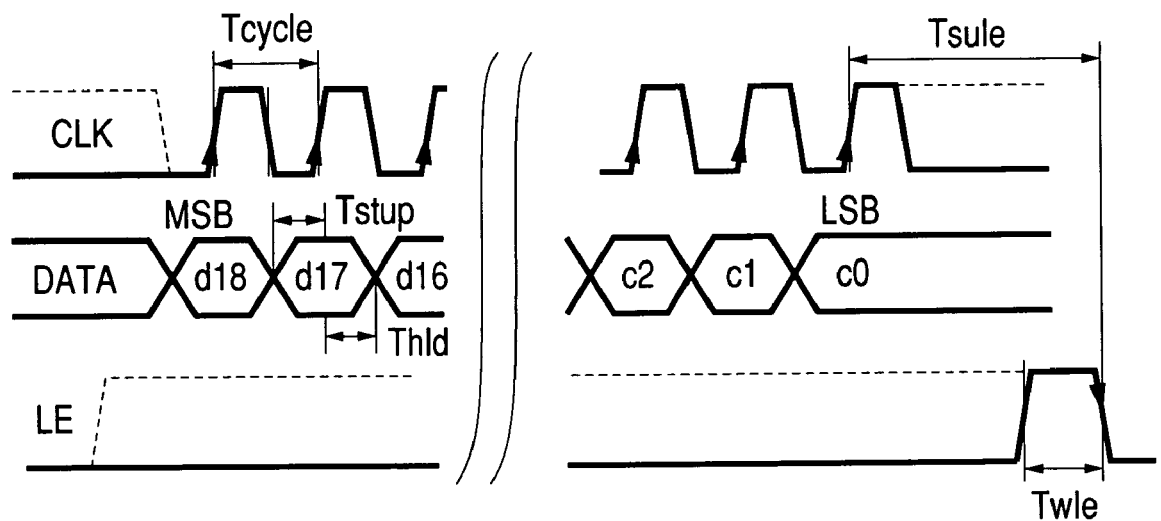
FIG. 15 is a timing chart of the serial interface shown in FIG. 14.

FIG. 1 is a block diagram of a wireless LAN system in the first embodiment of the present invention. FIG. 2 is a block diagram of an LPF/PGA circuit provided in the wireless LAN system shown in FIG. 1. FIG. 3 is a circuit diagram of a programmable gain amplifier provided in the LPF/PGA circuit shown in FIG. 2. FIG. 4 is a circuit diagram of a variable gain amplifier provided in the programmable gain amplifier shown in FIG. 3. FIG. 5 is an illustration for describing how a target signal is amplified by the LPF/PGA circuit shown in FIG. 2. FIG. 6 is a block diagram of a first measurement circuit provided in the wireless LAN system shown in FIG. 1. FIG. 7 is a block diagram of a control circuit provided in the wireless LAN system shown in FIG. 1. FIG. 8 is a block diagram of a gain control circuit provided in the wireless LAN system shown in FIG. 1. FIG. 9 is a flowchart of the operation of the control circuit provided in the wireless LAN system shown in FIG. 1. FIG. 10 is a time-series chart for describing the processing flow of the wireless LAN system shown in FIG. 1. FIG. 11 is an illustration for describing the waveforms of baseband signals in a short symbol period of the wireless LAN system shown in FIG. 1. FIG. 12 is a table of various types of signals exchanged between an RF processing block and a baseband processing block in the wireless LAN system shown in FIG. 1. FIG. 13 is a table for describing the details of various settings by MODE signals in the control signals shown in FIG. 12. FIG. 14 is a detailed register map of the serial interface shown in FIG. 12. FIG. 15 is a timing chart of the signals in the serial interface shown in FIG. 14.

In this first embodiment, the wireless LAN system 1 uses a wave as a transmission path to build up a LAN (Local Area Network). The wireless LAN system 1, as shown in FIG. 1, is configured by receiving antennas 2 and 3, an antenna switch 4, a transmission antenna 5, a transmission amplifier 6, an RF processing block 7, and a baseband processing block 8.

The RF processing unit 7 is configured by an LNA, a first mixer 10, second mixers 11 and 12, an adder 13, an OSC 14, an LPF 15, LPF/PGA circuits 16 and 17, a first measurement circuit 18, a gain control circuit (test signal generation block and gain control block) 19, an adjustment circuit 20, transmission baseband amplifiers 21 and 22, first transmission mixers 23 and 24, and a second transmission mixer 25. The baseband processing block 8 is configured by a second measurement circuit 26, a control circuit (gain control block) 27, a modulation circuit 28, and a demodulation circuit 29.

Each of the RF processing block 7 and the baseband processing block 8 is configured by, for example, a one-chip semiconductor integrated circuit device for RF processing.

The OSC 14 generates a clock signal according to a reference clock SCLK inputted from external to supply it to the first and second mixers 10, 11, and 12, as well as to the first and second transmission mixers 23 to 25.

Signals are received by either of the receiving antenna 2 or 3 selected by the antenna switch 4 according to whether or not the antenna satisfies a predetermined receiving condition. This antenna switch 4 is controlled by the antenna switch switchover signal AS output from the control circuit 27. The received signal is amplified by the LNA 9, which is a low noise amplifier, then converted to an intermediate frequency one by the first mixer 10.

The received signal is then converted to baseband signals by the second mixers 11 and 12. After that, the baseband signals are amplified by the LPF/PGA circuits 16 and 17 so that the signals come to have a proper level respectively. Consequently, so-called I and Q baseband signals are transmitted to a rear-step baseband processing block 8 separately to be demodulated by the demodulation circuit 29.

On the other hand, transmission signals are converted to base-band signals (I and Q signals), then passed to the transmission baseband amplifiers 21 and 22, then converted to target RF signals by the first and second transmission mixers 23 to 25. After that, the transmission signals are amplified by the transmission amplifier 6 and output from the transmission antenna 5.

The AGC (Automatic Gain Control) circuit is used at the receiving side for adjusting the signal levels of the I and Q signals. And, the first and second measurement circuits 18 and 26 are used to measure the level of each signal for such level adjustments. The first measurement circuit 18 measures the level of each signal by compressing the signal level logarithmically after removing disturbing signals from the signal Add output from the adder 13 with use of the LPF 15. The signal Add is obtained by adding up M1 and M2 output from the second mixers 11 and 12. The measured signal (first signal level measurement signal) is output as MR1.

The second measurement circuit 26 measures the levels of the I and Q signals to be demodulated later with no modification of their linear shapes and outputs each measured signal as MR2 (second signal level measured signal). The signal output from the first and second measurement circuits 18 and 26 are transmitted to the control circuit 27 respectively to generate gain setting value time divisional data TD according to the measurement result. The data TD is used to control the gains of the LPF/PGA blocks 16 and 17 through the gain control circuit 19 so that the I and Q signals reach the target levels.

The gain control circuit 19 develops the gain setting value time divisional data TD received from the control circuit 27 to an LNA gain switchover signal GC and a PGA gain setting value data (first and second gain setting data) GD under the control of a mode control signal MC and a DC offset cancel control/gain data latch signal (DC offset cancel signal) KS generated by the control circuit 27. The signals GC and GD are output to the LNA 9 and the LPF/PGA circuits 16 and 17 respectively.

In the transmission system circuit adjustment, the gain control circuit 19 outputs a transmission circuit adjustment command CC according to which the modulation circuit 28 generates a test signal. And, according to the test signal, the adjustment circuit 20 measures the output levels of the transmission baseband amplifiers 21 and 22 and adjusts the amplifiers 21 and 22 so that they stay within a predetermined range respectively.

FIG. 2 shows a block diagram of the LPF/PGA circuit 16 (17).

The LPF/PGA circuit 16 (17) is configured by low-path filters F1 to F3 and programmable gain amplifiers GA1 to GA3 that are connected to each other alternately. The gain of the programmable gain amplifier GA1 (to GA3) is controlled according to the PGA gain setting value data GD.

The signal KS inputted to each of the programmable gain amplifiers GA1 to GA3 cancels the DC offset to be generated at the time of gain switchover in each of the GA1 to GA3.

Next, the internal configuration of the GA1 (to GA3) will be described with reference to FIG. 3.

The GA1 (to GA3) is configured by an input short switch 30, an abstractor 31, a variable gain amplifier 32, an amplifier 33, a capacitance element 34, and a sampling switch 35.

The input short switch 30 switches between an input signal IN and a reference voltage Vref. One of the connection parts of the input short switch receives the input signal IN while the other connection part receives the reference voltage Vref.

A common connection part of the input short switch 30 is connected to an input block of the variable gain amplifier 32 and the output block of the variable gain amplifier 32 is connected to the other connection part of the sampling switch 35.

The variable gain amplifier 32 receives PGA gain setting value data GD and the output gain of the amplifier 32 is varied according to this data GD. This variable gain amplifier 32 outputs a signal OUT through its output block.

One connection part of the sampling switch 35 is connected to one connection part of the capacitance element 34 and the input block of the amplifier 33 respectively. The other connection part of the capacitance element 34 is connected to the reference voltage VSS. The output block of the amplifier 33 is connected to the subtractor 31. The capacitance element 34 retains a DC offset at normal operation. The subtractor 31 and the amplifier 33 feedback the DC offset generated in the output of the variable gain amplifier 32 to the input.

Both of the input short switch 30 and the sampling switch 35 are turned on/off according to the DC offset cancel control/gain data latch signal KS. The sampling switch 35 samples the DC offset to be output to the capacitance element 34.

In this programmable gain amplifier GA1 (to GA3), the signal KS enables the input short switch 30 to be connected to the reference voltage Vref. When the sampling switch 35 closes, the DC offset generated in the output of the variable gain amplifier 32 is amplified by the amplifier 33, then fed back to the variable gain amplifier 32 through the subtractor 31.

Consequently, the DC offset of the output signal OUT output from the variable gain amplifier 32 is suppressed.

If the input short switch 30 is connected to the input signal IN due to the signal DC offset cancel control/gain data latch signal KS and the sampling switch 35 opens while the DC offset is suppressed, the DC offset cancel voltage is retained in the capacitance element 34 and the input signal IN is inputted to the variable gain amplifier 32 while the DC offset cancellation is kept.

Next, an internal configuration of the variable gain amplifier 32 will be described with reference to FIG. 4.

The variable gain amplifier 32 is configured by gain selection switches GSW1 and GSW2, DC offset sources SETV1 to SETV3, and amplifiers AP1 to AP3.

The common connection part of the gain selection switch GSW1 receives the input signal IN. The gain selection switch GSW1 selects one of the DC offset sources SET1 to SET3 according to the PGA gain setting value data GD, thereby outputting a predetermined signal to the selected source.

The SET1 to SET3 are connected to the corresponding input blocks of the amplifiers AP1 to AP3. The signal output from any one of the amplifiers AP1 to AP3 is output as a signal OUT through the gain selection switch GSW2 controlled according to the PGA gain setting value data GD.

Each of the amplifiers AP1 to AP3 has its unique gain. The AP1 to AP3 are selected by the corresponding gain selection switches GSW1 and GSW2. Each of the amplifiers AP1 to AP3 has its DC offset independently so that a different DC offset voltage is generated at each gain switchover.

As described above, two gain switches GSW1 and GSW2 are used for controlling the switchover between them in FIG. 4. However, one of the GSW1 and GSW2 may be omitted.

Next, a description will be made for how the LPF/PGA circuit 16 (,17) amplifies a target signal with reference to FIG. 5.

FIG. 5 shows a graph for a target signal, a adjacent disturbance signal, and a non-adjacent disturbance signal on the right side. The horizontal axis shows the frequency while the vertical axis shows the signal level.

For example, according to the IEEE802.11a, a target signal has a tolerance range in which the adjacent disturbance signal is allowed within +16 dB while the non-adjacent disturbance signal is allowed within +32 dB. When a target signal is amplified up to the target signal level, therefore, the circuit saturation to be caused by disturbance signals must be prevented. To satisfy this requirement, the characteristics of the necessary low-path filters and programmable gain amplifiers are divided, for example, into three steps and the filter and the amplifier are disposed alternately.

If a target signal, an adjacent disturbance signal, and a non-adjacent disturbance signal are inputted together, the low-path filter F1 removes the disturbance signals to some extent, then the programmable gain amplifier GA1 amplifies the target signal.

Then, the low-path filter F2 further removes the disturbance signals and the programmable gain amplifier GA2 further amplifies the target signal. Similarly, the low-path filter F3 removes the disturbance signals and the programmable gain amplifier GA3 amplifies the target signal so that the target signal has a required level.

At this time, the disturbance cut-off characteristics of the low-path filters F1 to F3 and the gains of the programmable gain amplifiers GA1 to GA3 are controlled properly, thereby the target signal is amplified without causing saturation in any circuit through which the signals passes.

Next, the internal configuration of the first measurement circuit 18 will be described with reference to FIG. 6.

The first measurement circuit 18 is configured by a low-path filter 36, a wave detection circuit 37, and a log amplifier 38. The low-path filter 36 removes disturbance signals and the wave detection circuit 37 converts each signal inputted through the low-path filter 36 to a DC voltage. The log amplifier 38 compresses the DC voltage converted by the wave detection circuit 37 logarithmically.

This configuration can correspond to a wide range of input signal levels so as to measure the level of each detected signal roughly.

Next, the internal configuration of the control circuit 27 will be described with reference to FIG. 7.

The control circuit 27 is configured by a processor 39, a program memory 40, a data memory 41, an input port 42, an output port 43, and a bus 44. The processor 39 controls the operation of the control circuit according to a program.

The program memory 40 stores programs to be executed by the processor 39. The data memory 41 stores results of program execution temporarily. The input port 42 receives measured signals MR1 and MR2 from the first and second measurement circuits 18 and 26.

The output port 43 outputs the gain setting value time divisional data TD, the mode control signal MC, the DC offset cancel control/gain data latch signal KS, the antenna switch switchover signal AS, the transmission circuit adjustment command CC, and the transmission circuit adjustment signal generation command CD. The processor 39, the program memory 40, the data memory 41, the input port 42, and the output port 43 are connected to each other through a bus 44.

The gain control circuit 19 controls the operations of the whole system including receiving system gain controlling, transmission system circuit adjustment, and receiving antenna selection.

Next, the internal configuration of the gain control circuit 19 will be described.

The gain control circuit 19, as shown in FIG. 8, is configured by a gain latch selection register 45, gain latches 46 and 47, and a mode decoder 48.

The gain latch selection register 45 selects either of the gain latches 46 or 47 to retain target data received therefrom. The gain latch 46 retains gain data to be set in the LNA 9 and the programmable gain amplifiers GA1 and GA2. The gain data is included in the gain setting value time divisional data TD received in a time division manner.

The gain latch 47 retains gain data to be set in the programmable gain amplifier GA3. The gain data is included in the gain setting value time divisional data TD received in a time division manner. The mode decoder 48 decodes the inputted mode control signal MC and outputs the transmission circuit adjustment command CC.

In the initial status in which the mode control signal MC indicates an operation other than receiving, the gain latch selection register 45, as well as the gain latches 46 and 47 are all cleared.

When the mode control signal MC indicates receiving, the gain latch selection register 45, as well as the gain latches 46 and 47 are activated to stand by respectively. At this time, the output terminal Q of the gain latch 46 outputs "0" as a gain latch selection signal, thereby writing into the gain latch 46 is enabled while writing into the gain latch 47 is disabled. In FIG. 7, the "E" denotes an enable terminal and the "D" denotes a data terminal.

The gain latch 46 latches gain setting value time divisional data TD at the rising edge of an inputted DC offset cancel control/gain data latch signal KS.

The output terminal Q of this gain latch 46 outputs a PGA gain setting value GD and an LNA gain switchover signal GC to be set in the LNA 9, as well as in the programmable gain amplifiers GA1 and GA2 respectively.

The value in the gain latch selection register 45 is inverted at the falling edge of the DC offset cancel control/gain data latch signal KS, thereby writing in the gain latch 46 is disabled while writing in the gain latch 47 is enabled.

On the bother hand, the gain latch 47 latches gain setting value time divisional data TD at the rising edge of the DC offset cancel control/gain data latch signal KS.

The output terminal Q of this gain latch 47 outputs PGA gain setting value data GD to be set in the programmable gain amplifier GA3.

The MODE signal, when receiving one packet ends, is initialized to wait for the next receiving.

Next, the operation of this embodiment will be described.

FIG. 9 shows a flowchart of the operation of the gain control circuit 19.

At first, the MODE signal is set in the receiving state (step S101). Then, the gain control circuit 19 outputs an antenna switch changeover signal AS to measure the signal levels of the signals received by the receiving antenna 2 through the first measurement circuit 18 (step S102).

The gain control circuit 19 then determines whether or not there is any received signal of which signal level is over a predetermined sensitivity (step S103). Concretely, the gain control circuit 19 determines whether or not the signal level of each received signal is over −82 dBm, which is determined as the minimum receiving sensitivity in the IEEE802.11a standard.

If there is no signal of which signal level is over −82 dBm in step 103, the gain control circuit 19 outputs another antenna switch switchover signal AS to measure the signal levels of the signals received by the receiving antenna 3 through the first measurement circuit 18 (step S104).

Then, the gain control circuit 19 determines whether or not there is any received signal of which signal level is over −82 dBm again (step S105). If there is no signal of which signal level is over −82 dBm in step 105 again, the gain control circuit 19 repeats the processings in steps S102 to S105.

If any received signal of which signal level is over −82 dBm is detected in step S103 or S105, the gain control circuit 19 sets gain setting value time divisional data TD in the gain latch 46 according to the level of the received signal measured in the first measurement circuit 18, then sets a rough gain value (about 64 dB) in each of the LNA 9 and the programmable gain amplifiers GA1 and GA2 to make rough gain controlling (step S106).

After the detection of such a received signal, the gain control circuit 19 suspends the switching between the receiving antennas until the packet receiving ends.

After the rough gain controlling, the gain control circuit 19 cancels the DC offset, then instructs the second measurement circuit 26 to measure signal levels of received signals again (step S107). The control circuit 19 sets gain setting value time divisional data TD in the gain latch 47 according to the signal level measured by the second measurement circuit 26 to set a minute gain (about ±2 dB) in the programmable gain amplifier GA3 (in step S108).

The minute gain controlling ends in this step S108, thereby the auto gain controlling ends.

Figure 18:
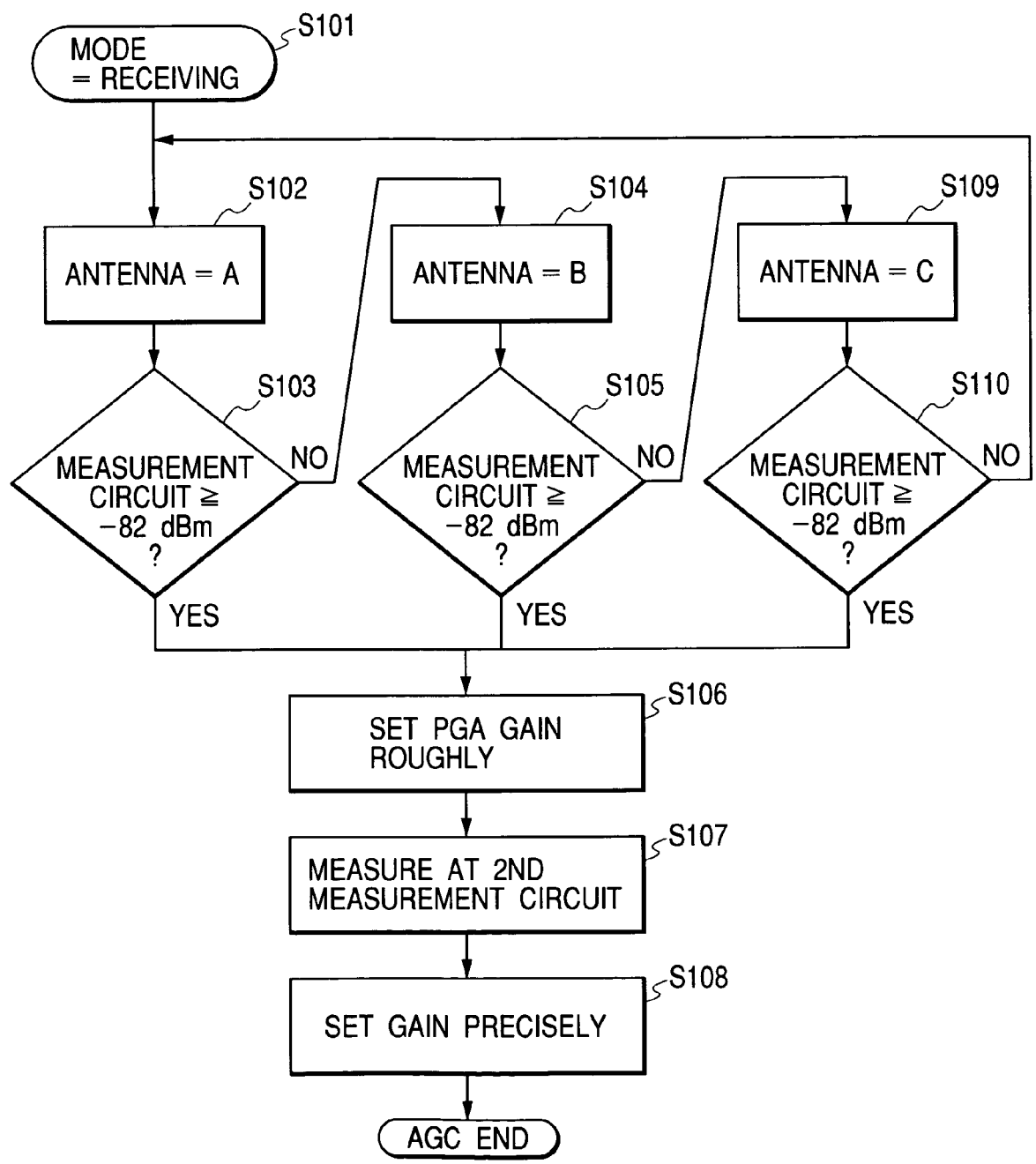
FIG. 18 is another flowchart of the operation of the control circuit provided in the wireless LAN system shown in FIG. 1.

FIG. 18 shows a flowchart of such gain controlling when three receiving antennas are used.

In this connection, if there is no received signal of which signal level is over −82 dBm in step S105, the first measurement circuit 18 measures signal levels of the signals received by the third receiving antenna (step S109).

Similarly to the above case, the gain control circuit 19 determines whether or not there is any received signal of which signal level is over −82 dBm (step S110). If there is no received signal of which signal level is over −82 dBm in step S105, the gain control circuit 19 repeats the processings in steps S102 to S110.

The processings in steps S101 to S104, as well as in steps S106 to S108 are the same as those shown in FIG. 9, so that the description for them will be omitted here. If four receiving antennas are used, the gain controlling may be done conforming to the above case.

FIG. 10 shows a time-series chart for describing the flowchart shown in FIG. 9.

FIG. 10 shows, from top to bottom, how received signals, that is, the MODE signal, the antenna switch switchover signal AS, the input signal to the first measurement circuit 18, the DC offset cancel control/gain data latch signal KS, the gain latch selection signal output from the gain latch selection register 45, the gain setting value time divisional data TD, the gain switchover to the LNA 9/gain setting value to be set in the programmable gain amplifiers GA1 to GA3, and input signals (I and Q signals) to the second measurement circuit 26 are changed in status.

At first, the MODE signal is set for receiving, then the receiving antennas 2 and 3 are switched over alternately by the antenna switch switchover signal AS. After that, the first measurement circuit 18 measures signal levels of received signals. The control circuit 19 waits for an input signal of which signal level is over a predetermined receiving sensitivity.

In this case, when the antenna switch switchover signal AS is '0' and the first measurement 18 is ready to measure signal levels of received signals, no received signal is detected. However, when the antenna switch switchover signal AS is inverted in status to change the receiving antenna and the first measurement circuit 18 is ready to measure signal levels of received signals again, received signals are detected.

The control circuit 19, when receiving a signal of which signal level is over the minimum receiving sensitivity, sets a gain value in the LNA 9 and a rough gain value in each of the programmable gain amplifiers GA1 and GA2 according to the received signal level measured by the first measurement circuit 18.

The control circuit 27 outputs a gain value to be set in each of the LNA 9 and the programmable gain amplifiers GA1 and GA2 to the gain setting value time divisional data TD. Then, the control circuit 27 activates the DC offset cancel control/gain data latch signal KS to enable the gain control circuit 19 to latch gain data.

If the gain changes in each of the LNA 9 and the programmable gain amplifiers GA1 and GA2, the DC offset also changes. Thus, the control circuit 19 keeps '1' in the DC offset cancel control/gain data latch signal KS and cancels the DC offset during that period.

While the DC offset is canceled, the input to each of the programmable gain amplifiers GA1 and GA2 is shorted with the reference voltage Vref. Thus, the second measurement circuit 26 comes to receive only DC signals left over after AC signals are removed from the input signals (I and Q signals).

In a time that is enough to cancel the DC offset, the gain control circuit 19 sets '0' in the DC offset cancel control/gain data latch signal KS.

Then, AC signals are inputted to the LNA 9 and both of the programmable gain amplifiers GA1 and GA2. The second measurement circuit 26 thus begins measuring of signal levels of received signals.

When the DC offset cancel control/gain data latch signal KS becomes '0' (at the falling edge), the gain latch selection register 45 latches the MODE signal and sets '1' in the gain latch selection signal so that the gain latch 47 receives the next gain value.

The gain control circuit 19 sets a minute gain in the programmable gain amplifier GA3 according to the signal level measured by the second measurement circuit 26. The control circuit 27 thus outputs a gain value to be set in the programmable gain amplifier GA3 to the gain setting value time divisional data TD.

After that, the control circuit 27 activates the DC offset cancel control/gain data latch signal KS and instructs the gain control circuit 19 to latch gain data. After that, the control circuit 27 cancels the DC offset while keeping '1' in the DC offset cancel control/gain data latch signal KS.

FIG. 11 shows the waveforms of the baseband signals (I and Q signals) during a short symbol period. As shown in the upper and middle steps in FIG. 11, both I and Q signals are shifted by ½ cycle (0.4 μs) when 0.8 μs is assumed as one cycle.

Those I and Q signals are processed to output a signal for repeating the shifting by ½ cycle (0.4 μs) as shown in the lower step (I+Q) in FIG. 11.

See the frequency spectrum shown at the right side in FIG. 11. In the case of the I or Q signal, all the carriers used in the short symbol period are observed. In the case of the I+Q, however, it would be understood that the lowest frequency components of the I and Q signals are deleted.

Consequently, it would be understood that signal levels are measured only in the 0.8 μs-cycle measurement in the case of the I or Q signal individually. However, in the case of the I+Q, signal levels can be measured in ½-cycle measurements.

FIG. 12 shows various types of signals exchanged between the RF processing block 7 and the baseband processing block 8.

FIG. 12 shows, from top to bottom, signals received by the baseband processing block 8 from the RF processing block 7, control signals exchanged between the RF processing block 7 and the baseband processing block 8, and signals output from the baseband processing block 8 to the RF processing block 7.

FIG. 12 also shows, from left to right, fields of terminal name, attribute, function, remark, and correspondence to signals shown in FIG. 1.

FIG. 13 shows details of settings by the MODE signals included in control signals shown in FIG. 12. FIG. 14 shows a register map of a serial interface and FIG. 15 shows a timing chart of the serial interface.

According to the first embodiment, therefore, auto gain controlling can be done quickly and accurately, since rough gain controlling is done by measuring each signal level converted logarithmically in the first measurement circuit 18, then minute gain controlling is done with use of the signal level measured by the second measurement circuit 26.

Furthermore, because the RF processing block 7 measures the gain for rough controlling, the work load of the baseband processing block 8 is reduced.

Figure 16:
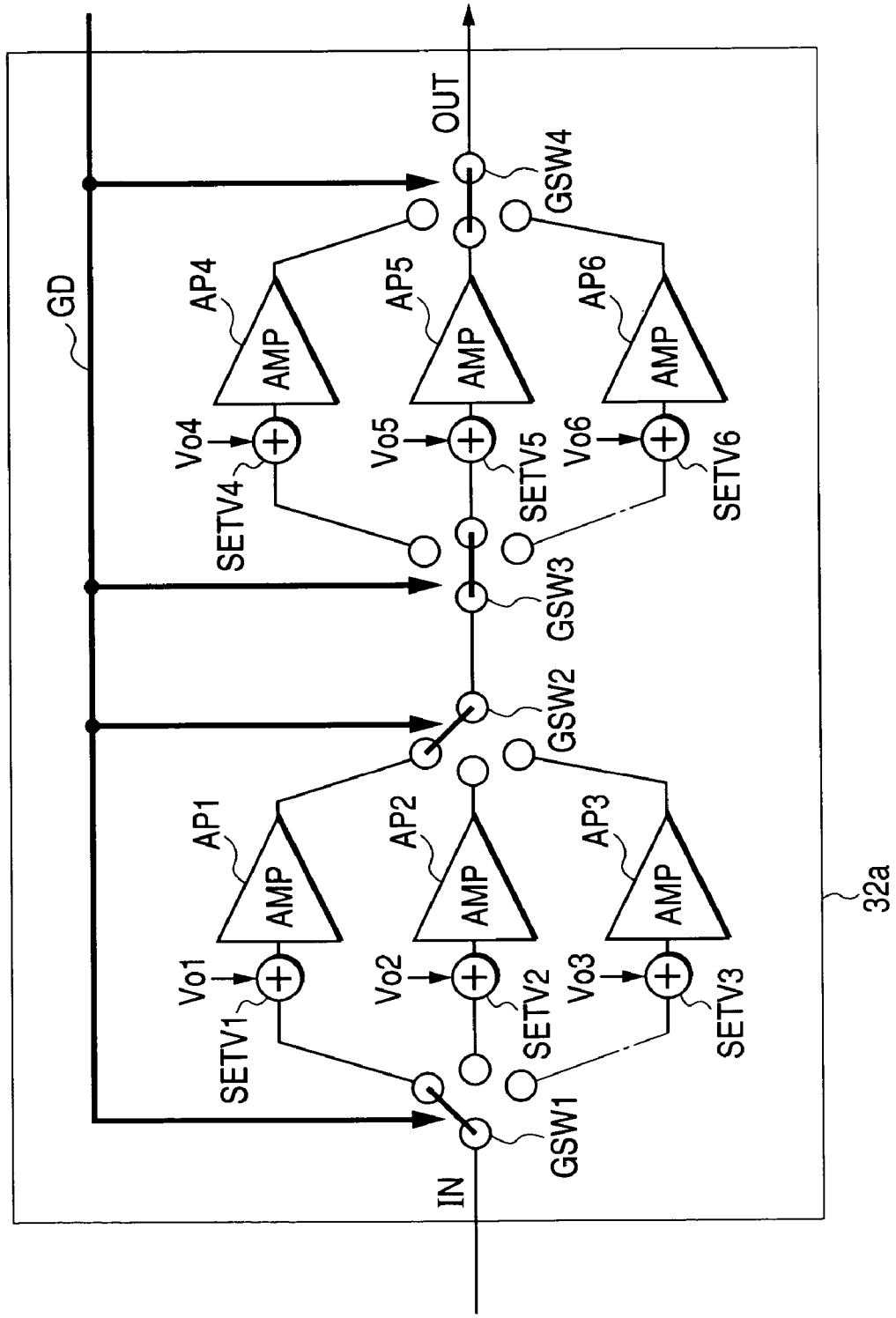
FIG. 16 is a circuit diagram of a variable gain amplifier in the second embodiment of the present invention.

Furthermore, although the variable gain amplifier 32 (FIG. 4) is configured by gain selection switches GSW1 and GSW2, DC offset sources SETV1 to SETV3, and amplifiers AP1 to AP3 in the first embodiment, the variable gain amplifier may be configured by two variable gain amplifiers shown in FIG. 4 connected serially as shown in FIG. 16.

In this connection, the variable gain amplifier 32a comes to be configured by gain selection switches GSW1 to GSW4, DC offset sources SETV1 to SETV6, and amplifiers AP1 to AP6.

The configurations of the gain selection switches GSW1 and GSW2, DC offset sources SETV1 to SETV3, and amplifiers AP1 to AP3 are the same as those shown in FIG. 4. The connections in the gain selection switches GSW3 and GSW4, DC offset sources SETV4 to SETV6, and amplifiers AP4 to AP6 are also the same as those shown in FIG. 4. Switching among the gain selection switches GSW1 to GSW4a is done according to the PGA gain setting value data GD.

The common connection part of the gain selection switch GSW2 is connected to the common connection part of the gain selection switch GSW3 and the common connection part of the gain selection switch GSW4 outputs a signal OUT.

Consequently, the gain of each of the I and Q signals is adjusted separately, so that the gain balance between the I and Q signals is controlled.

Although the four gain selection switches GSW1 to GSW4 are used to control the switching even in this case, either the GSW1 or GSW2 and either the GSW3 or GSW4 may be omitted respectively.

Figure 17:
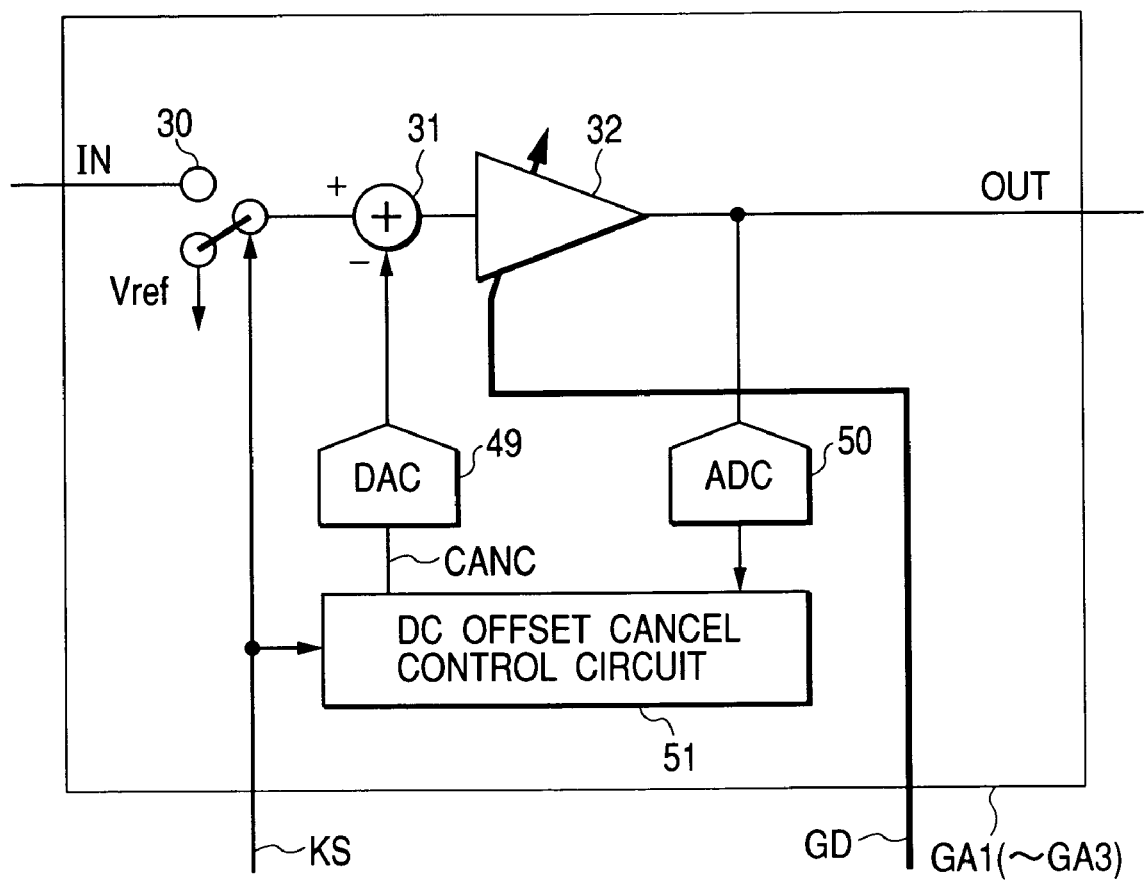
FIG. 17 is a block diagram of a programmable gain amplifier in the second embodiment of the present invention.

Each of the programmable gain amplifiers GA1 to GA3 (FIG. 3) may be configured with use of a DC offset cancel technique employed for portable telephone ICs as shown in FIG. 17.

In this connection, the programmable gain amplifier GA1 (to GA3), as shown in FIG. 17, is configured by a DAC 49, an ADC 50, and a DC offset cancel control circuit 51 that are provided newly instead of the amplifier 33 provided in itself GA1 (to GA3) shown in FIG. 3, the capacitance element 34, and the sampling switch 35.

The DAC 49 converts the digital DC offset cancel control signal CANC output from the DC offset cancel control circuit 51 to the analog signal CANC to generate a cancel voltage.

The ADC 50 samples the DC offset voltage of the variable gain amplifier 32 by converting the voltage from analog to digital. The DC offset cancel control circuit 51 instructs offset cancellation according to the value set in the DC offset cancel control/gain data latch signal KS.

If DC offset cancellation is instructed with the DC offset cancel control/gain data latch signal KS inputted to the DC offset cancel control circuit 51, the SDC 50 begins sampling of the offset voltage generated by the variable gain amplifier 32.

The DC offset cancel control circuit 51 then outputs a voltage for canceling the DC offset sampled by the ADC 50 to the DAC 49. After that, the ADC 50 samples the offset voltage generated by the variable gain amplifier 32 again and outputs a voltage for sampling the offset to the DAC 49 if the sampled voltage does not reach the target value yet.

Second Embodiment

Figure 19:
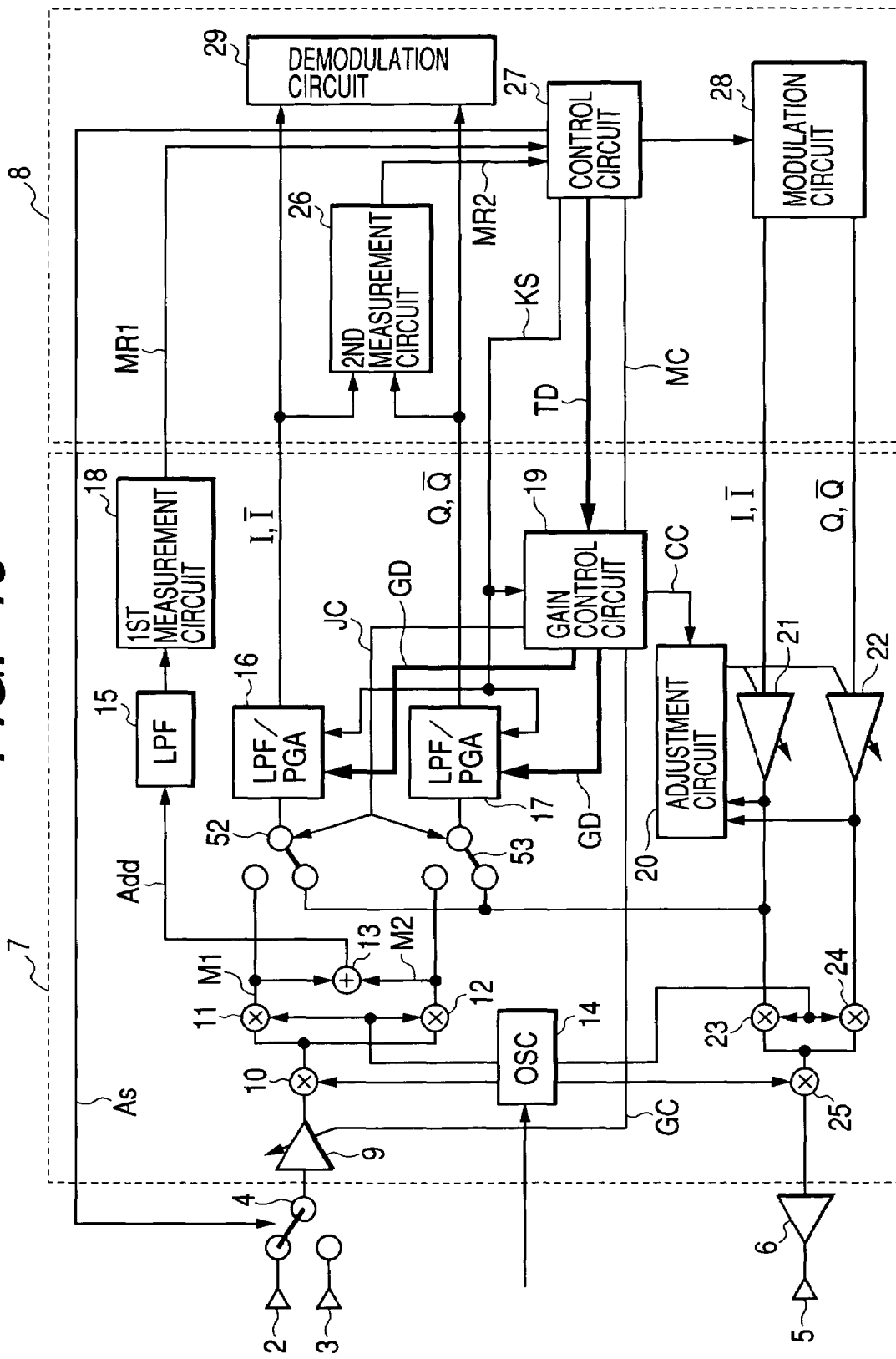
FIG. 19 is a block diagram of a wireless LAN system in the second embodiment of the present invention.

FIG. 19 shows a block diagram of a wireless LAN system in the second embodiment of the present invention.

In this second embodiment, a wireless LAN system 1a as shown in FIG. 19 is configured by receiving antennas 2 and 3, an antenna switch 4, a transmission antenna 5, a transmission amplifier 6, an RF processing block 7, and a baseband processing block 8. This configuration is the same as that shown in FIG. 1. However, the LAN system in this second embodiment is further provided with transmission/receiving bypass switches 52 and 53 newly.

A second mixer 11 is connected to one connection part of the bypass switch 52 and an LPF/PGA circuit 16 is connected to the common connection part of the bypass switch 52.

A second mixer 12 is connected to one connection part of the bypass switch 53 and an LPF/PGA circuit 17 is connected to the common connection part of the bypass switch 53. And, an output block of the transmission baseband amplifier 21 is connected to the other connection parts of the bypass switches 52 and 53 respectively.

These transmission/receiving bypass switches 52 and 53 are switched over according to the receiving circuit adjustment command JC output from the gain control circuit 19 to adjust the error between circuits of two I and Q signals of the receiving system.

To adjust such an error between circuits of the receiving system, the transmission/receiving bypass switches 46 and 47 are set so that the other connection parts of them are connected to the common connection part respectively. This setting is controlled by the receiving circuit adjustment command JC output from the gain control circuit 19 as described above.

Consequently, the transmission signal (I signal) is bypassed to the LPF/PGA circuits 16 and 17 at the receiving side, thereby the second measurement circuit 28 comes to measure the gain difference between the LPF/PGA circuits 16 and 17 as a gain difference between the I and Q signals.

According to the result of this measurement, the gain in each of the two LPF/PGA circuits 16 and 17 is controlled so as to be limited in a predetermined error range.

In this second embodiment, therefore, when a signal is transmitted, the signal is used to adjust the gain of the receiving circuit. The error of the received signal is thus adjusted very accurately without requiring any special adjusting time.

Figure 20:
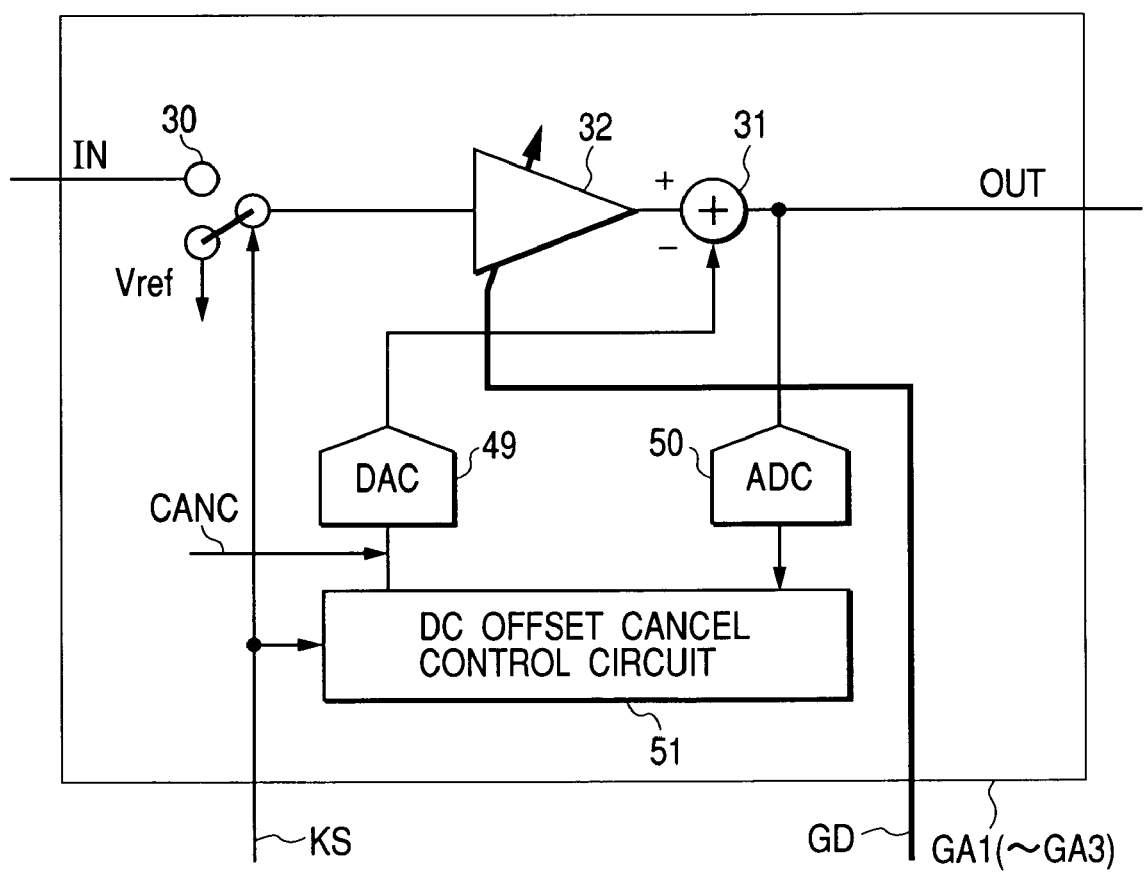
FIG. 20 is another block diagram of the control circuit in the second embodiment of the present invention.

FIG. 20 shows a variation of the GA 1 (to GA 3) shown in FIG. 17. In this variation shown in FIG. 20, the position of the subtractor 31 is changed from the input side of the variable gain amplifier 32 in FIG. 17 to the output side of the amplifier 32. According to this variation shown in FIG. 20, if the generated DC offset is small, the DAC resolution is reduced. This is an advantage of this embodiment.

While the preferred embodiments of the present invention have been described above, the present invention is not limited only to those embodiments. It is to be understood that modifications are apparent to those skilled in the art without departing from the spirit of the invention.

The effects to be obtained by the typical one of the objects of the present invention disclosed in this document will become as follows.

(1) It is possible to make auto gain controlling in such a received signal as wireless communication data quickly and accurately.

(2) It is possible to measure a logarithmically compressed signal level for controlling a programmable gain amplifier roughly, so that the work load of its corresponding baseband processing block is reduced.

(3) Furthermore, when a signal is transmitted, it is possible to use the signal to adjust the gain of the receiving side circuit. Thus, the error adjustment of each received signal is done accurately and efficiently.

What is claimed is:

1. A wireless LAN system, comprising:
a first measurement circuit for measuring a signal level of a received signal in wireless data communication and outputting a first signal level measurement signal used for rough gain controlling;
a second measurement circuit for measuring signal levels of inputted I and Q signals and outputting a second signal level measurement signal used for minute gain controlling;
a control circuit for generating a gain setting value according to said first and second signal level measurement signals output from said first and second measurement circuits;
a gain control circuit for generating first and second gain setting data according to the gain setting value output from said control circuit; and
a programmable gain amplifier for amplifying both I and Q signals according to said first and second gain setting data output from said gain control circuit.

2. The wireless LAN system according to claim 1, wherein said gain setting values output to said gain control circuit from said control circuit are time divisional data.

3. A wireless LAN system comprising:
a first measurement circuit for measuring a signal level of a received signal in wireless data communication and outputting a first signal level measurement signal used for gain controlling;
a control circuit for switching between at least two antennas at every certain time if no signal is detected in received signal detection carried out according to the result of measurement by said first measurement circuit, and suspending said switching if a signal is detected to generate an antenna switchover signal for fixing the connection of said antenna that has detected said received signal;
an antenna switch for controlling the switching between at least said two antennas according to an antenna switchover signal received from said control circuit;
a test signal generation block (gain control circuit) for generating a test signal according to a transmission circuit adjustment command; and
an adjustment circuit for measuring an output level of a transmission baseband amplifier according to a test signal output from said test signal generation block to adjust the output level of said transmission baseband amplifier so that said output level comes within a predetermined range.

4. An auto gain control system, comprising:
a plurality of measurement circuits, each used for measuring a signal level of a received signal in wireless data communication;
a gain control block for outputting gain setting data according to a signal level measured by each of said plurality of measurement circuits; and
a programmable gain amplifier for controlling a gain used to amplify each of I and Q signals according to each gain setting data output from said gain control block,
wherein each of said plurality of measurement circuits has a measurement accuracy different from others, and
wherein said programmable gain amplifier uses said plurality of gain setting data sequentially in an ascending order of signal level measurement accuracy to perform said controlling.

5. An auto gain control system, comprising:
a first measurement circuit for measuring a signal level of a received signal in wireless data communication and outputting a first signal level measurement signal used for logarithmically compressed rough gain controlling;
a second measurement circuit for measuring a signal level of each of inputted I and Q signals in a linear scale and outputting a second signal level measurement signal used for minute gain controlling;
a control circuit for generating a gain setting value according to said first and second signal level measurement signals output from said first and second measurement circuits;
a gain control circuit for generating first and second gain setting data according to the gain setting value output from said control circuit to make said gain controlling; and
a programmable gain amplifier for amplifying said I and Q signals according to said first and second gain setting data output from said gain control circuit.

6. The auto gain control system according to claim 5;
wherein said programmable gain amplifier is configured by three programmable gain amplifiers serially connected to each other,
wherein in two programmable gain amplifiers disposed in the front step, a gain is set which is respectively used to amplify said I and Q signals according to said first gain setting data generated from said first signal level measurement signal by said gain control circuit,
wherein in said programmable gain amplifier in the rear step, a gain is set which is used to amplify said I and Q signals according to said second gain setting data generated from said second signal level measurement signal by said gain control circuit.

7. The auto gain control system according to claim 6;
wherein each of said three programmable gain amplifiers is provided with a DC offset cancellation block for canceling an DC offset, and
wherein said control circuit outputs a DC offset cancel signal for canceling a DC offset generated upon switching among gains in said three programmable gain amplifiers.

8. The auto gain control system according to claim 5, further comprising:
a control circuit for determining whether or not a received signal is detected according to the result of measurement in said first measurement circuit and carrying out switching between at least two antennas at every fixed time if no signal is detected or suspending said switching between said two antennas if a received signal is detected, to generate a switchover signal for fixing the connection of said signal-received antenna; and an antenna switch block for switching between at least said two antennas according to an antenna switchover signal received from said control circuit.

9. The auto gain control system according to claim 5, further comprising:

a low noise amplifier for amplifying a signal received by one of said antennas, wherein said low noise amplifier has a gain controlled according to the gain switchover data generated by said gain control circuit from a gain setting value according to said first signal level measurement signal.

10. An auto gain control system comprising:

a measurement circuit for measuring a signal level of a received signal in wireless data communication;

a gain control block for calculating a gain of a programmable gain amplifier from a signal level measured by said measurement circuit and outputting the result as gain setting data; and a programmable gain amplifier for controlling a gain used to amplify each of I and Q signals according to gain setting data output from said gain control block, wherein first and second gain setting data output to said programmable gain amplifier block from said gain control circuit are time divisional data.

11. An auto gain control system, comprising:

a measurement circuit for measuring signal levels of inputted I and Q signals in a linear scale and outputting a first signal level measurement signal;

a control circuit for generating a gain setting value according to said first signal level measurement signal output from said measurement circuit;

a gain control circuit for controlling a gain used to generate second gain setting data according to said gain setting value output from said control circuit;

a programmable gain amplifier for amplifying I and Q signals according to said second gain setting data output from said gain control circuit; and a bypass switch for switching between destinations according to a switchover signal so as to transfer a signal output from a transmission baseband amplifier to said programmable gain amplifier at the time of signal transmission wherein said system switches over said bypass switch to output a transmit signal to said gain amplifier and instructs said measurement circuit to measure a characteristic error of each of I and Q signals output from said programmable gain amplifier to adjust the gain of said programmable gain amplifier.

* * * * *